(12) United States Patent
Mirkin et al.

(10) Patent No.: US 11,599,020 B2
(45) Date of Patent: Mar. 7, 2023

(54) POLYMER-ASSISTED SYNTHESIS OF NANOPARTICLES

(71) Applicant: NORTHWESTERN UNIVERSITY, Evanston, IL (US)

(72) Inventors: Chad A. Mirkin, Wilmette, IL (US); Pengcheng Chen, Evanston, IL (US); Yuan Liu, Evanston, IL (US); Jingshan Du, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 531 days.

(21) Appl. No.: 16/832,453

(22) Filed: Mar. 27, 2020

(65) Prior Publication Data

US 2020/0310248 A1 Oct. 1, 2020

Related U.S. Application Data

(60) Provisional application No. 62/824,617, filed on Mar. 27, 2019.

(51) Int. Cl.

| | |
|---|---|
| *G03F 7/00* | (2006.01) |
| *C09D 11/102* | (2014.01) |
| *C08K 5/56* | (2006.01) |
| *C08G 65/48* | (2006.01) |
| *B82Y 40/00* | (2011.01) |
| *B82Y 30/00* | (2011.01) |

(52) U.S. Cl.
CPC ........... *G03F 7/0002* (2013.01); *C08G 65/48* (2013.01); *C08K 5/56* (2013.01); *C09D 11/102* (2013.01); *B82Y 30/00* (2013.01); *B82Y 40/00* (2013.01); *C08K 2201/011* (2013.01)

(58) Field of Classification Search
CPC ....................................................... B82Y 10/00
See application file for complete search history.

(56) References Cited

FOREIGN PATENT DOCUMENTS

WO WO-2014/039821 A1 3/2014

OTHER PUBLICATIONS

Chai et al., Nanoreactors for Studying Single Nanoparticle Coarsening, J. Am. Chem. Soc. 2012, 134:158-61.
Chai et al., Scanning Probe Block Copolymer Lithography, Proc. Nat. Acad. Sci. U.S.A. 2010, 107, 20202-6.

(Continued)

*Primary Examiner* — Ian A Rummel
(74) *Attorney, Agent, or Firm* — Marshall, Gerstein & Borun LLP

(57) ABSTRACT

A method of preparing a metal nanoparticle can include depositing an ink on a substrate using nanolithography to form a polymer reactor, wherein the ink comprises at least one metalloporphyrin functionalized polymer comprising a metal ion, porphyrin, and a polyethylene oxide polymer; and thermally annealing the polymer nanoreactor under conditions sufficient to form the nanoparticle. The thermal annealing can include a first stage that includes annealing the polymer nanoreactor at a temperature of about 100° C. to about 350° C. for a time sufficient to aggregate the metal ions in the polymer reactor, and a second stage that includes annealing the aggregated polymer nanoreactor at a temperature of about 500° C. to about 600° C. for a time sufficient to reduce the metal ion and decompose a polymer component of the polymer nanoreactor to thereby form the metal nanoparticle.

20 Claims, 21 Drawing Sheets

(56) References Cited

OTHER PUBLICATIONS

Chen et al., Polyelemental Nanoparticle Libraries, Science 2016, 352, 1565-9.
Chen et al., Hairy Uniform Permanently Ligated Hollow Nanoparticles with Precise Dimension Control and Tunable Optical Properties, J. Am. Chem. Soc. 2017, 139, 12956.
Chen et al., Interface and Heterostructure Design in Polyelemental Nanoparticles, Science 2019, 363, 959-64.
Chen et al., Structural Evolution of Three-Component Nanoparticles in Polymer Nanoreactors, J. Am. Chem. Soc. 2017, 139, 9876.
Chen et al., Tip-Directed Synthesis of Multimetallic Nanoparticles, J. Am. Chem. Soc. 2015, 137, 9167.
Cheng et al., Nanopatterning Self-Assembled Nanoparticle Superlattices by Moulding Microdroplets, Nat. Nanotechnol. 2008, 3, 682-90.
Ding et al., A General Synthesis Approach for Supported Bimetallic Nanoparticles via Surface Inorganometallic Chemistry, Science 2018, 362, 560.
Du et al., The Structural Fate of Individual Multicomponent Metal-Oxide Nanoparticles in Polymer Nanoreactors, Angew. Chem. Int. Ed. 2017, 56, 7625-9.
Flauraud et al., Nanoscale Topographical Control of Capillary Assembly of Nanoparticles, Nat. Nanotechnol. 2017, 12, 73-80.
Giovannetti, The Use of Spectrophotometry UV-Vis for the Study of Porphyrins. Macro to Nano Spectroscopy, Uddin, J., Ed. 2012; p. 87.
Gologan et al., Ion/surface Reactions and Ion Soft-Landing, Phys. Chem. Chem. Phys. 2005, 7, 1490-500.
Heaven et al., Crystal Structure of the Gold Nanoparticle [N(C8H17)4][Au25(SCH2CH2Ph)18], J. Am. Chem. Soc. 2008, 130, 3754.
Herzing et al., Identification of Active Gold Nanoclusters on Iron Oxide Supports for CO Oxidation, Science 2008, 321, 1331-5.
Hossain et al., Alloy Clusters: Precise Synthesis and Mixing Effects, Acc. Chem. Res. 2018, 51, 3114-24.
Hu et al., Silver-Assisted Thiolate Ligand Exchange Induced Photoluminescent Boost of Gold Nanoclusters for Selective Imaging of Intracellular Glutathione, Chem. Mater. 2018, 30, 1947-55.
Imaoka et al., Platinum Clusters With Precise Nos. of Atoms for Preparative-Scale Catalysis, Nat. Commun. 2017, 8, 688.
Iyyamperumal et al., Efficient Electrocatalytic Oxidation of Formic Acid Using Au@Pt Dendrimer-Encapsulated Nanoparticles, J. Am. Chem. Soc. 2013, 135, 5521-4.
Jamet et al., Magnetic Anisotropy of a Single Cobalt Nanocluster, Phys. Rev. Lett. 2001, 86, 4676-9.
Javey et al., Regular Arrays of 2 nm Metal Nanoparticles for Deterministic Synthesis of Nanomaterials, J. Am. Chem. Soc. 2005, 127, 11942-3.
Jiang et al., Site-Specific Prodrug Release Using Visible Light, J. Am. Chem. Soc. 2008, 130, 4236-7.
Jibril et al., Massively Parallel Nanoparticle Synthesis in Anisotropic Nanoreactors, Acs Nano 2019, 13, 12408-14.
Jin et al., Atomically Precise Colloidal Metal Nanoclusters and Nanoparticles: Fundamentals and Opportunities, Chem. Rev. 2016, 116, 10346-413.
Johnson et al., Monodisperse Au11 Clusters Prepared by Soft Landing of Mass Selected Ions, J. Anal. Chem. 2011, 83, 8069-72.
Johnson et al., Soft Landing of Complex Molecules on Surfaces. Annual Review of Analytical Chemistry, vol. 4, Cooks, R. G.; Yeung, E. S., Eds. 2011; vol. 4, p. 83.
Kaden et al., Electronic Structure Controls Reactivity of Size-Selected Pd Clusters Adsorbed on TiO2 SurfacesScience 2009, 326(5954):826-9.
Kang et al., Tailoring the Photoluminescence of Atomically Precise Nanoclusters, Chem. Soc. Rev. 2019, 48, 2422-57.
Lei et al., Increased Silver Activity for Direct Propylene Epoxidation via Subnanometer Size Effects, Science 2010, 328, 224-8.
Li et al., Atomically Precise Gold Nanoclusters as New Model Catalysts, Acc. Chem. Res. 2013, 46, 1749-58.
Liu et al., Aerobic Oxidation of Cyclohexane Catalyzed by Size-Controlled Au Clusters on Hydroxyapatite: Size Effect in the Sub-2 nm Regime, ACS Catal. 2011, 1, 2-6.
Liu et al., Delineating the Pathways for the Site-Directed Synthesis of Individual Nanoparticles on Surfaces, Proc. Nat. Acad. Sci. U.S.A. 2013, 110, 887-91.
Liu et al., Metal Catalysts for Heterogeneous Catalysis: From Single Atoms to Nanoclusters and Nanoparticles, Chem. Rev. 2018, 118, 4981-5079.
McCaffrey et al., Template Synthesis of Gold Nanoparticles with an Organic Molecular Cage, J. Am. Chem. Soc. 2014, 136, 1782-5.
Moliner et al., Reversible Transformation of Pt Nanoparticles into Single Atoms inside High-Silica Chabazite Zeolite, J. Am. Chem. Soc. 2016, 138, 15743-50.
Pang et al., A General and Robust Strategy for the Synthesis of Nearly Monodisperse Colloidal Nanocrystals, Nat. Nanotechnol. 2013, 8, 426-31.
Scott et al., Bimetallic Palladium?Platinum Dendrimer-Encapsulated Catalysts, J. Am. Chem. Soc. 2003, 125, 3708-9.
Sljivancanin et al., Supported Fe Nanoclusters: Evolution of Magnetic Properties With Cluster Size, Phys. Rev. Lett. 2003, 90, 247202.
Tsukamoto et al., Atom-hybridization for Synthesis of Polymetallic Clusters, Nat. Commun. 2018, 9, 3873.
Tyo et al., Catalysis by Clusters With Precise Numbers of Atoms, Nat. Nanotechnol. 2015, 10, 577-88.
Wang et al., Magnesium-Ion Batteries: High-Rate and Long Cycle-Life Alloy-Type Magnesium?Ion Battery Anode Enabled Through (De)magnesiation-lnduced Near-Room-Temperature Solid— Liquid Phase Transformation, Adv. Energy Mater. 2019, 9, 1803771.
Wong et al., Synthesis of Ultrasmall, Homogeneously Alloyed, Bimetallic Nanoparticles on Silica Supports, Science 2017, 358, 1427.
Yan et al., Single-Atom Pd1/Graphene Catalyst Achieved by Atomic Layer Deposition: Remarkable Performance in Selective Hydrogenation of 1,3-Butadiene, J. Am. Chem. Soc. 2015, 137, 10484-7.
Yang et al., Catalytically Active Au-G(OH)x-species Stabilized by Alkali Ions on Zeolites and Mesoporous Oxides, Science 2014, 346, 1498-501.
Zhang et al., Fabrication of Single-Nanocrystal Arrays, Adv. Mater. 2019, 32(18):e1904551.
Zhang et al., Synthesis and Catalytic Activity of Crown Jewel-Structured (IrPd)/Au Trimetallic Nanoclusters, Adv. Mater. 2015, 27, 1383-8.
Zhu et al., Kinetically Controlled, High-Yield Synthesis of Au25 Clusters, J. Am. Chem. Soc. 2008, 130, 1138-9.
Zhu et al., Atomically Precise Au25(SR)18 Nanoparticles as Catalysts for the Selective Hydrogenation of Alpha,beta-Unsaturated Ketones and Aldehydes, Angew. Chem. Int. Ed. 2010, 49(7):1295-8.
Zhu et al., Correlating the Crystal Structure of a Thiol-Protected Au25 Cluster and Optical Properties, J. Am. Chem. Soc. 2008, 130, 5883-5.

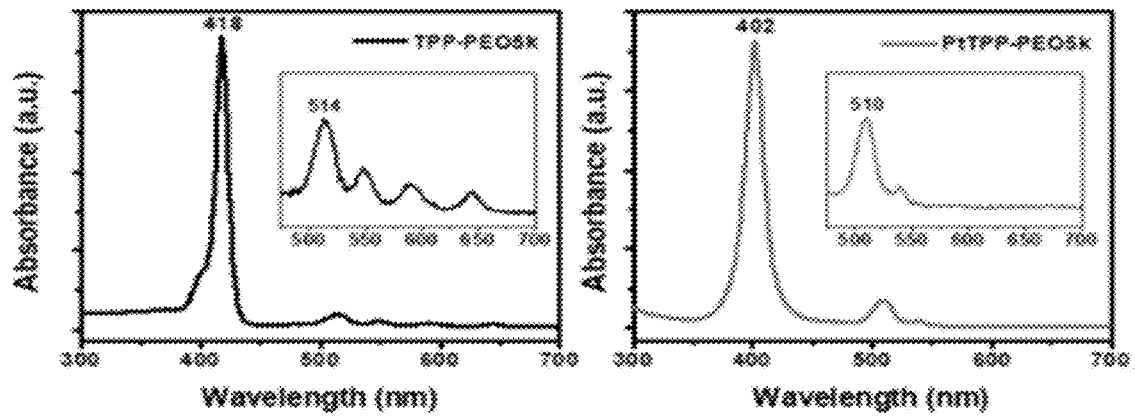
Figure 3A
Figure 3B
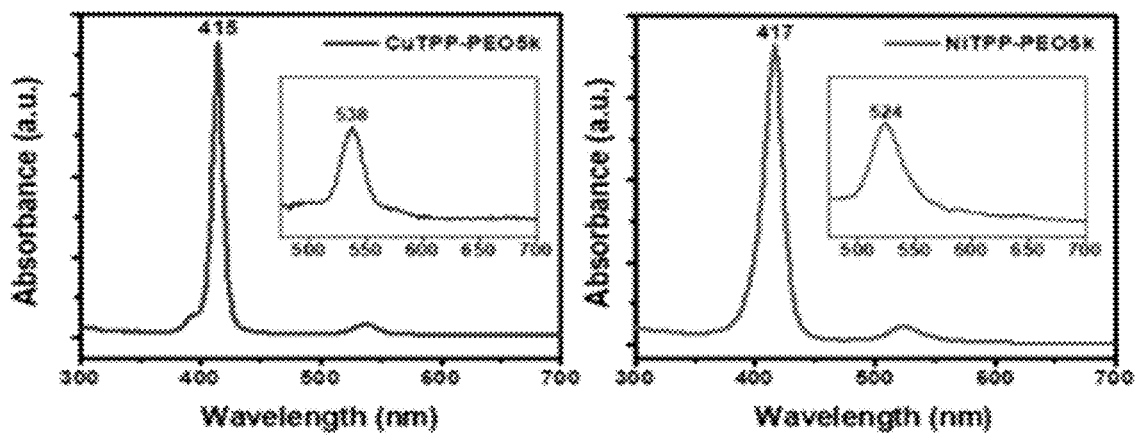
Figure 3C
Figure 3D
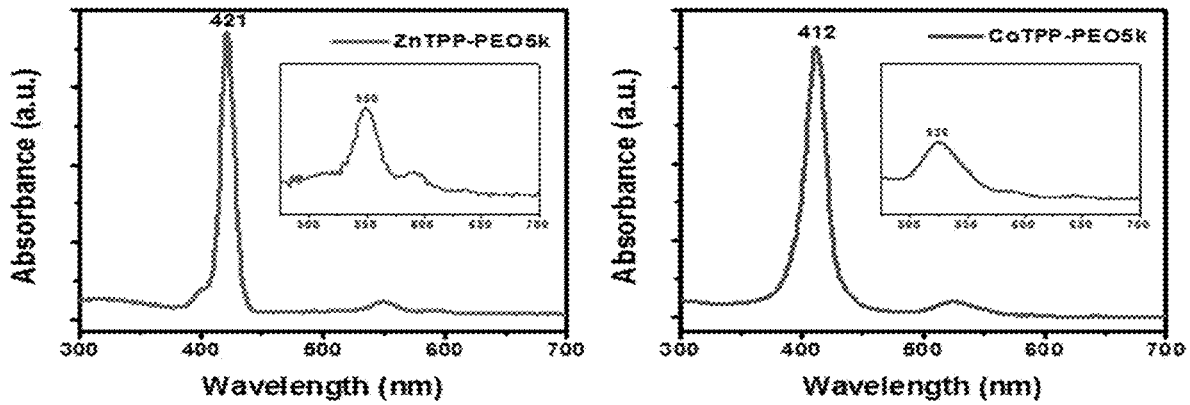
Figure 3E
Figure 3F

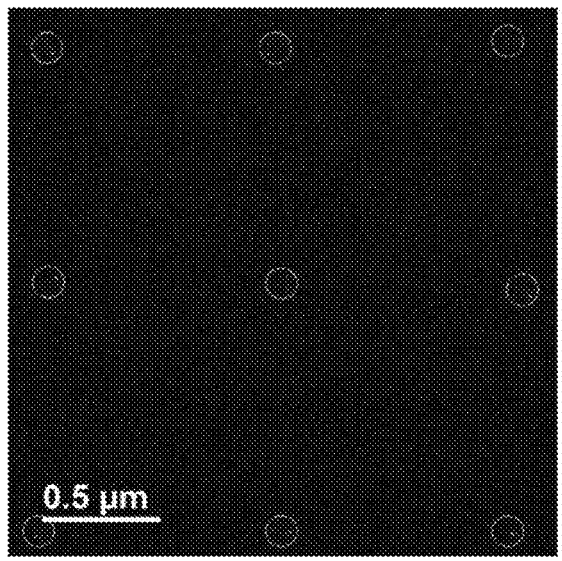
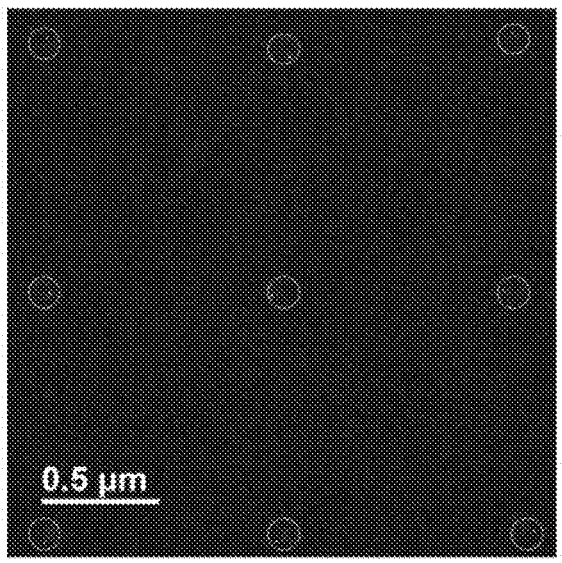
Figure 5C Figure 5D
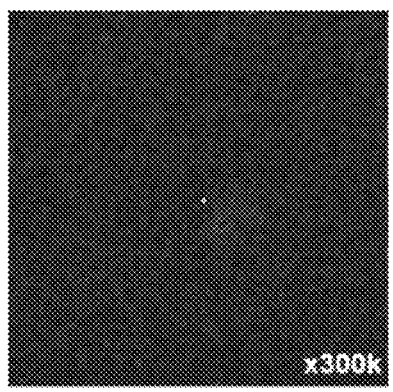
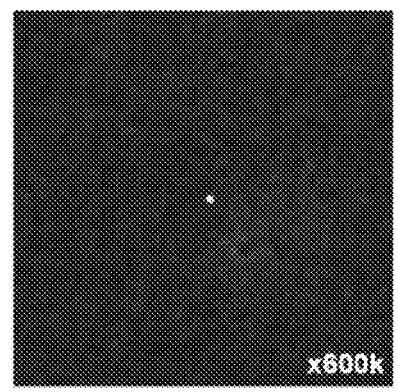
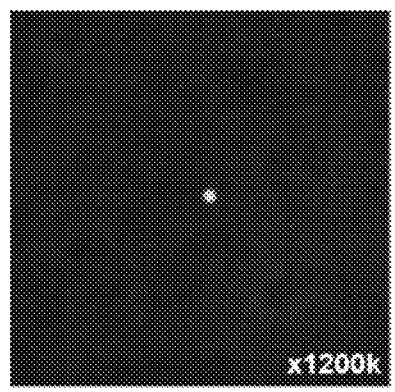
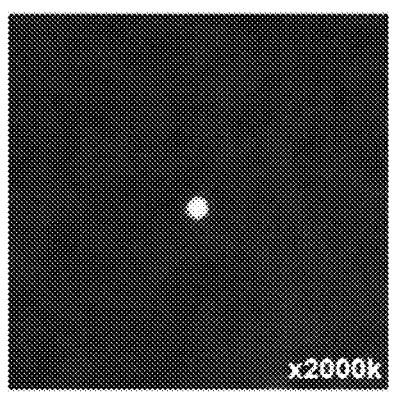
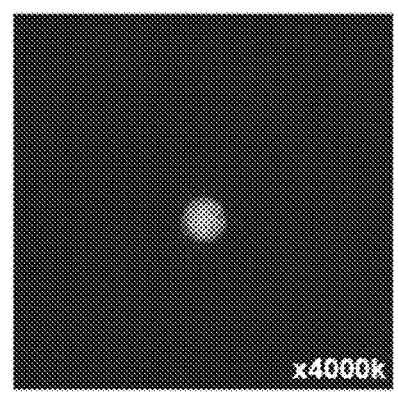
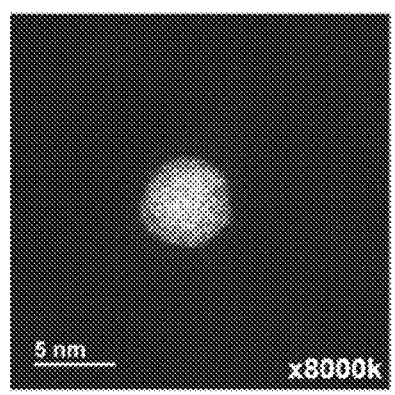
Figure 5E

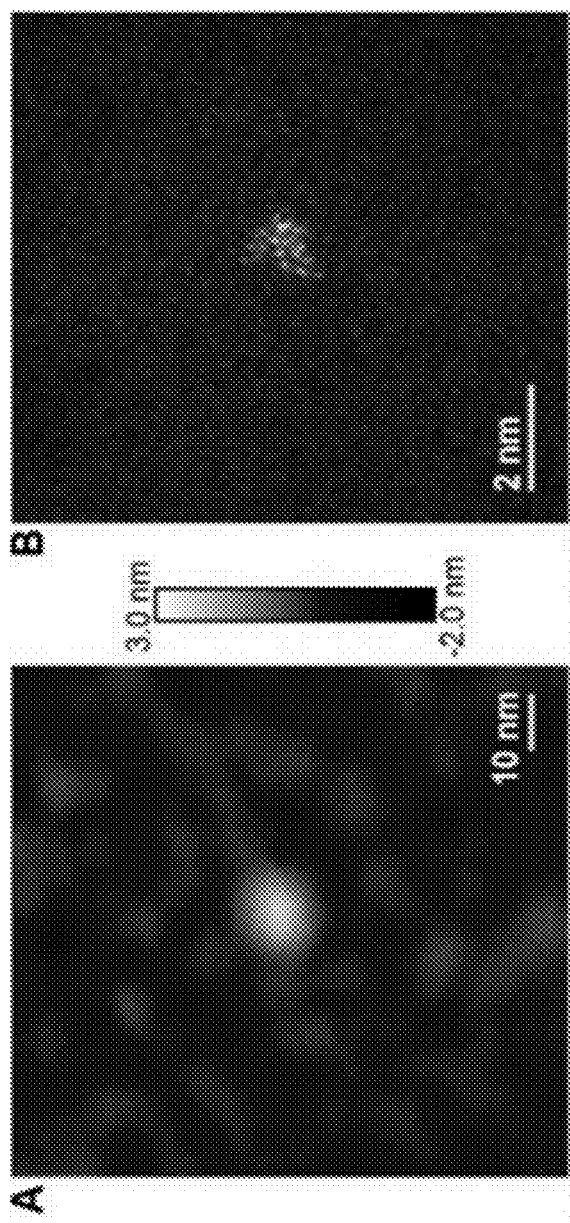
Figure 6A
Figure 6B
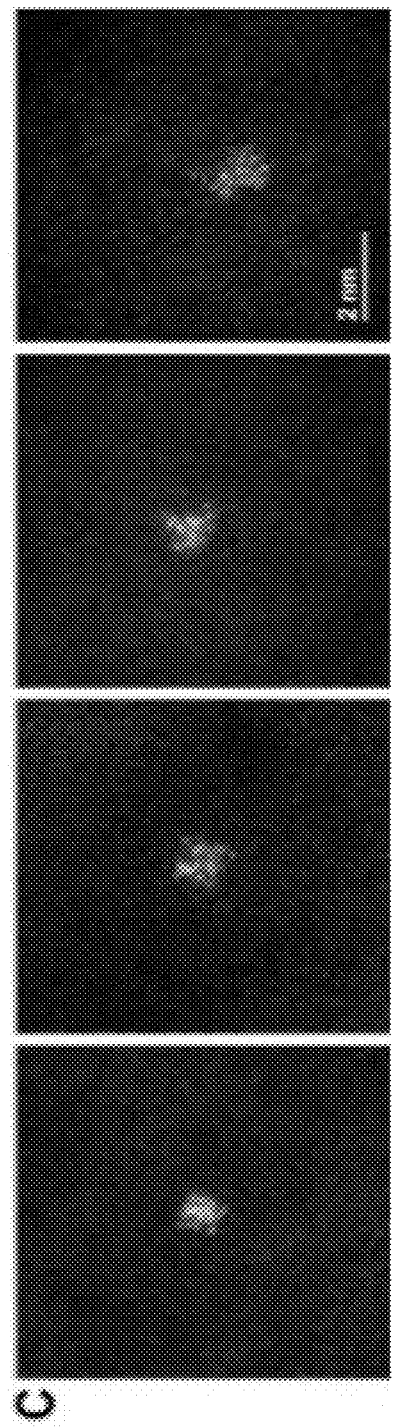
Figure 6C

POLYMER-ASSISTED SYNTHESIS OF NANOPARTICLES

CROSS-REFERENCE TO RELATED APPLICATION

The benefit of priority to U.S. Provisional Patent Application No. 62/824,617 filed Mar. 27, 2019 is hereby claimed and the disclosure is incorporated herein by reference in its entirety.

STATEMENT OF GOVERNMENT INTEREST

This invention was made with government support under W911NH-15-1-0151 awarded by the Army Research Office, IIP-1621773 awarded by the National Science Foundation, and FA9550-12-1-0141 awarded by the Air Force Office of Scientific Research. The government has certain rights in the invention.

BACKGROUND

Field of the Disclosure

The disclosure generally relates to methods of forming nanoparticles and ultra-small nanoparticles, and more particularly, to methods of making nanoparticles and ultra-small nanoparticles using metalloporphryin functionalized polyethylene oxide nanolithography inks.

Brief Description of Related Technology

Ultra-small nanoparticles that have less than 300 atoms and diameters less than 2 nm, commonly referred to as nanoclusters, have attracted extensive interest due to their properties that differ from either single atoms or larger colloidal nanoparticles. (1-4) When the size of nanoparticles approaches the nanocluster regime, the particles exhibit discrete molecular orbitals, in contrast with the continuous energy bands characteristic of typical metal nanoparticles. (4-7) In addition, the high surface-area-to-volume ratio of nanoclusters makes their geometric structures highly dependent on their environment such as solvents and supports. (4, 8) These electronic and geometric structural characteristics give nanoclusters interesting catalytic, (8-15) optical, (16, 17) and magnetic properties. (18, 19) To date, many methods have been established to synthesize ultra-small nanoparticles. For example, by controlling the nucleation and growth process, bulk solution-based synthesis can be used to synthesize nanoclusters with a precise number of atoms. (11-13, 21-23) Alternatively, nanoclusters can be accessed utilizing molecular template-mediated synthesis, (24-30) where the template (e.g., dendrimers, star-shaped polymers, and molecular cages) restricts the growth of the nanoparticles by limiting the amount of precursors present. In addition to chemical methods, physical deposition techniques such as soft-landing of mass-selected ions and atomic layer deposition are also used to create ultra-small nanoparticles. (5, 9, 15, 31-33) In addition to these advances in nanocluster synthesis, ways of positioning individual particles on surfaces have also been developed. (34-36) Of these, scanning probe block copolymer lithography (SPBCL) is one of the most versatile and powerful, typically allowing particles as many as seven elements spanning 2.5-60 nm. (37-44). No methods have been developed to make ultra-small particles in a site-isolated manner, yet the realization of such capabilities could open avenues to a wider variety of functional devices that take advantage of size- and compositionally dependent properties uniquely associated with such clusters. (45, 46)

SUMMARY

In accordance with embodiments, a method of preparing a metal nanoparticle can include depositing an ink on a substrate using nanolithography to form a polymer reactor, wherein the ink comprises at least one metalloporphyrin functionalized polymer comprising metal ions, porphyrin, and a polyethylene oxide polymer; and thermally annealing the polymer nanoreactor under conditions sufficient to form the nanoparticle. The thermal annealing can include a first stage that includes annealing the polymer nanoreactor at a temperature of about 100° C. to about 350° C. for a time sufficient to aggregate the metal ions in the polymer reactor, and a second stage that includes annealing the aggregated polymer nanoreactor at a temperature of about 500° C. to about 600° C. for a time sufficient to reduce the aggregated metal ions and decompose a polymer component of the polymer nanoreactor to thereby form the metal nanoparticle.

BRIEF DESCRIPTION OF THE DRAWINGS

FIGS. 3A-3F are UV-Vis absorption spectra of (A) TPP-PEO5k, and metal loaded TPP-PEO5k as follows: (B) PtTPP-PEO5k. (C) CuTPP-PEO5k, (D) NiTPP-PEO5k, (E) ZnTPP-PEO5k, and (F) CoTPP-PEO5k in dichloromethane; inset in each is zoomed-in UV-Vis spectra;

FIGS. 5C and 5D are HAADF-STEM images of 3×3 arrays of Pt nanoparticles synthesized in accordance with methods of the disclosure by thermally annealing PtTPP-PEO5k polymer nanoreactors;

FIG. 5E is a series of stepwise zoomed in HAADF-STEM images of the position of an original PtTPP-PEO5k dot confirming single Pt nanoparticle formation after thermal annealing using methods of the disclosure;

FIG. 6A is an AFM topographical image of a polymer nanoreactor with a diameter of less than 20 nm;

FIGS. 6B and 6C are HAADF-STEM images of Pt nanoparticles synthesized in accordance with embodiments of the disclosure, using nanoreactors having a diameter of less than 20 nm;

DETAILED DESCRIPTION

Disclosed herein are lithography inks that are uniform or substantially uniform at the molecular level through the use of polymers functionalized with a metalloporphyrin and methods of using such inks to form nanoparticles and/or nanoclusters in a site-specific and size-controlled manner. Nanoclusters are also referred to herein as ultra-small nanoparticles. Generally, ultra-small nanoparticles have a diameter or effective diameter of less than about 2 nm. Methods of the disclosure can be used for generation of such ultra-small nanoparticles, as well as nanoparticles having a diameter or effective diameter of greater than 2 nm.

While scanning probe block copolymer lithography can be used to synthesize nanoparticles, it is believed that weak binding between the metal precursor and the pyridine groups in the polymers leads to non-uniform polymer ink, making it difficult to synthesize uniform ultra-small nanoparticles. In a typical SPBCL experiment, either an AFM tip or a cantilever-free array of elastomeric pyramids are used to print attoliter-scale volumes of metal-coordinated poly(ethylene oxide)-b-poly(2-vinyl pyridine) (PEO-b-P2VP) nanoreactors onto a substrate in a site-specific manner. The metal precursors are then thermally converted into a nanoparticle within each nanoreactor. It has been found that SPBCL could be used to synthesize smaller nanoparticles or even single atoms by further decreasing the volume and metal loading of the polymer nanoreactors if the non-uniformity of the polymer ink can be addressed.

Without intending to be bound by theory, it is believed that replacement of the pyridine groups in PEO-b-P2VP with stronger metal-coordinating moieties, porphyrins, and chemically controlling the number of porphyrins per polymer chain, resulted in molecularly-uniform ink materials. This design fixes the stoichiometry between metal atoms and polymers. Accordingly, molecularly uniform inks can be provided for printing nanoreactors using nanolithographic techniques.

Porphyrin was found to be a strong metal coordination site for synthesizing single metal atom-coordinated polymers. Porphyrin has 18 conjugated and delocalized π electrons that can lead to two types of light absorption bands, i.e., B band and Q band. The B band involves the transition of π electrons from the ground state to the second excited state, while the Q band is a result of t electron transitioning from the ground state to the first excited state.

Figure 1:
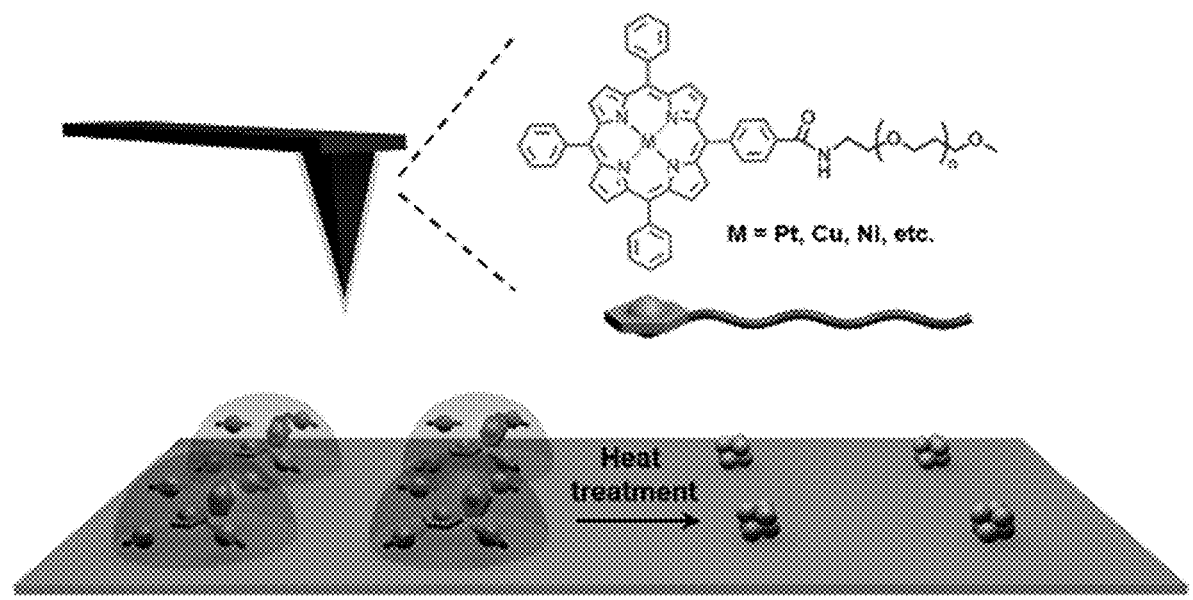
FIG. 1 is a schematic illustration of a method of polymer-mediated synthesis of ultra-small nanoparticles in accordance with embodiments of the disclosure.

Referring to FIG. 1, in embodiments, the end of a PEO chain can be functionalized with a metalloporphyrin. Both porphyrin and PEO molecules contain a single functional group, either carboxyl or amine, for coupling, which leads to a 1:1 reaction between the two reactants to form the desired polymer. To prepare the porphyrin functionalized PEO for printing, the functionalized polymer is coordinated with one or more metals to thereby form the metal-atom functionalized polymer inks.

In embodiments, the PEO molecule used in forming the ink can be can be one or more of methoxy-poly(ethylene oxide) amine, methoxy-poly(ethylene oxide) tosylate, and multi-arm star poly(ethylene oxide) amine. For example, the PEO can be methoxy-PEO5k amine ($M_n$=5000 g/mol).

In embodiments, the porphyrin can be one or more of 5,10,15-triphenyl-20-(4-carboxyphenyl) porphyrin, 5,10,15-tri(4-hydroxyphenyl)-20-(4-carboxyphenyl) porphyrin, and 5,10,15-tri(4-sulfonatophenyl)-20-(4-carboxyphenyl) porphyrin.

The porphyrin functionalized polymer can be prepared by admixing the PEO molecule and the porphyrin molecule with hexafluorophosphate azabenzotriazole tetramethyl uranium (HATU) and N,N-diisopropylethylamine (DIPEA) as coupling agents. Both the porphyrin and PEO molecules contain a single functional group, either carboxyl or amine, for coupling, which leads to a 1:1 reaction between the two reactants to form the desired polymer.

Figure 2:
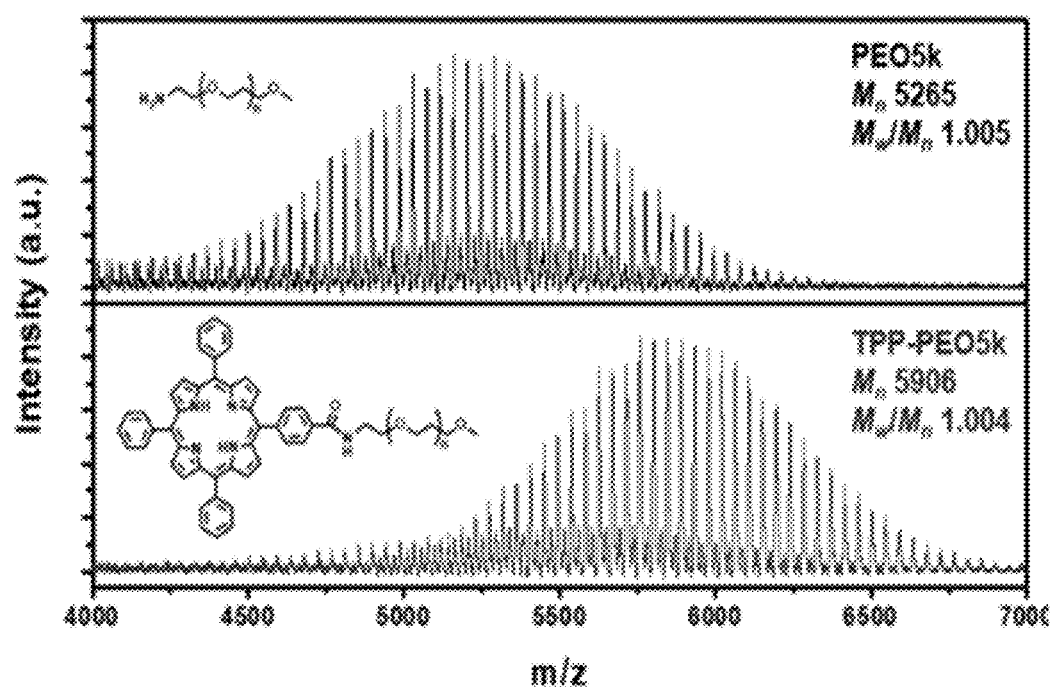
FIG. 2 is a MALDI-TOF MS spectra of poly(ethylene oxide) and tetraphenylporphyrin-terminated PEO (TPP-PEO5k)
Figure 4A:
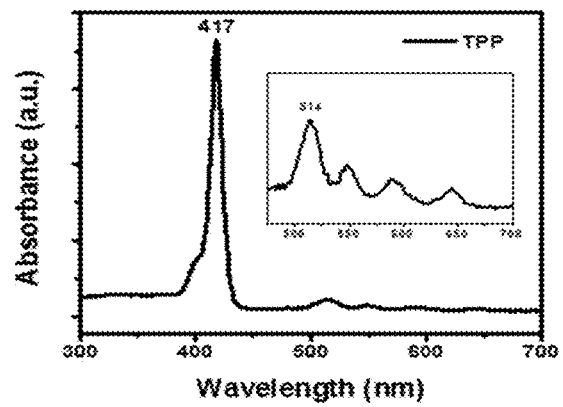
FIGS. 4A-4F are UV-Vis absorption spectra of (A) TPP, and metal loaded TPP as follows: (B) PtTPP, (C) CuTPP, (D) NiTPP, (E) ZnTPP, and (F) CoTPP.
Figure 4B:
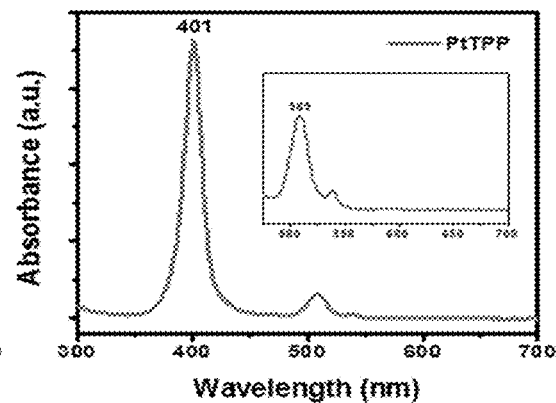
Figure 4C:
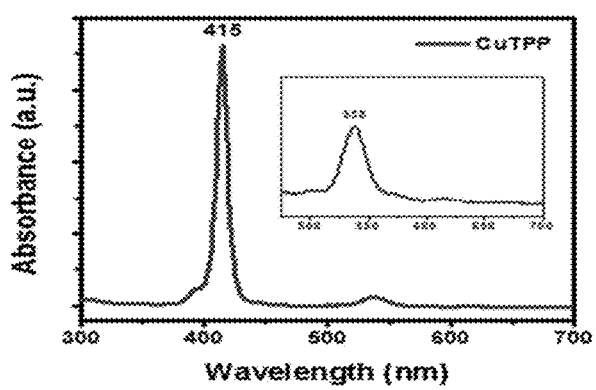
Figure 4D:
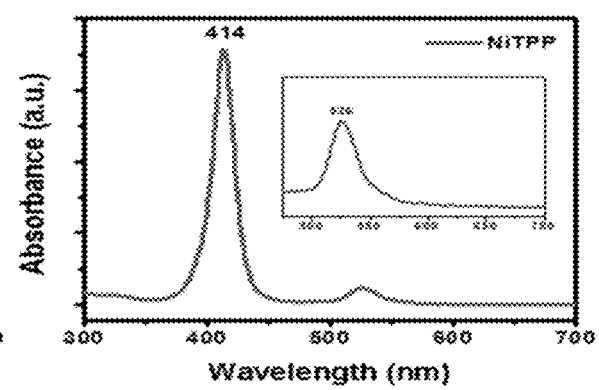
Figure 4E:
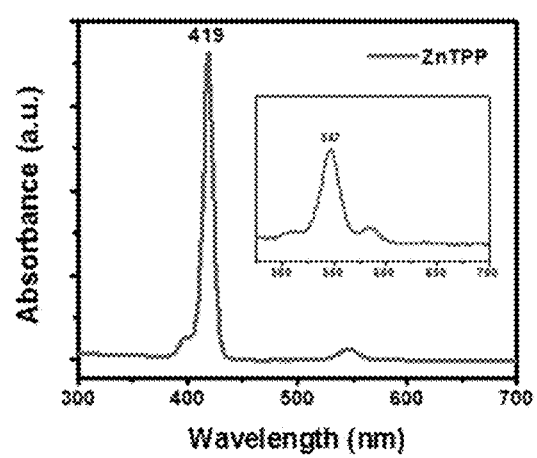
Figure 4F:
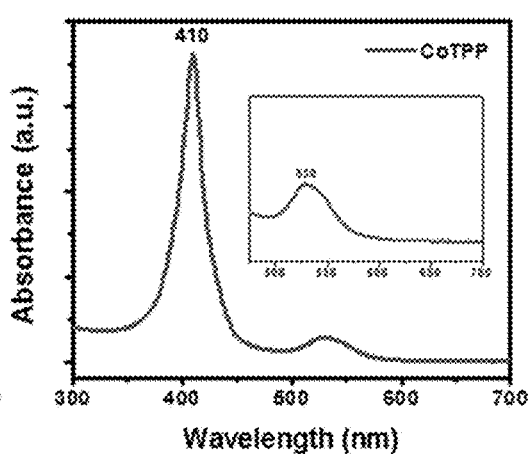
Figure 5A:
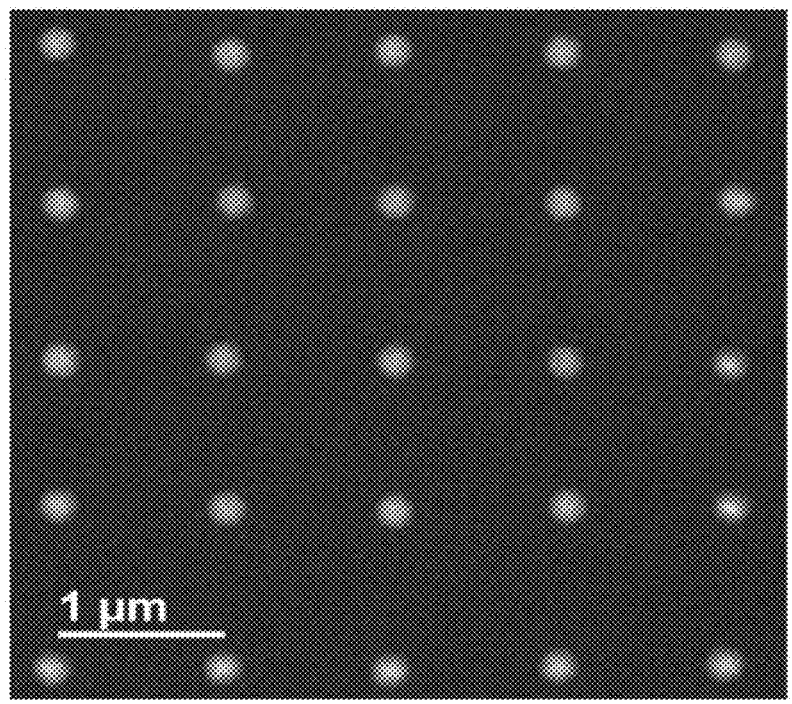
FIG. 5A is an HAADF-STEM image of a 5×5 array of polymer nanoreactors formed using an ink in accordance with the disclosure.
Figure 5B:
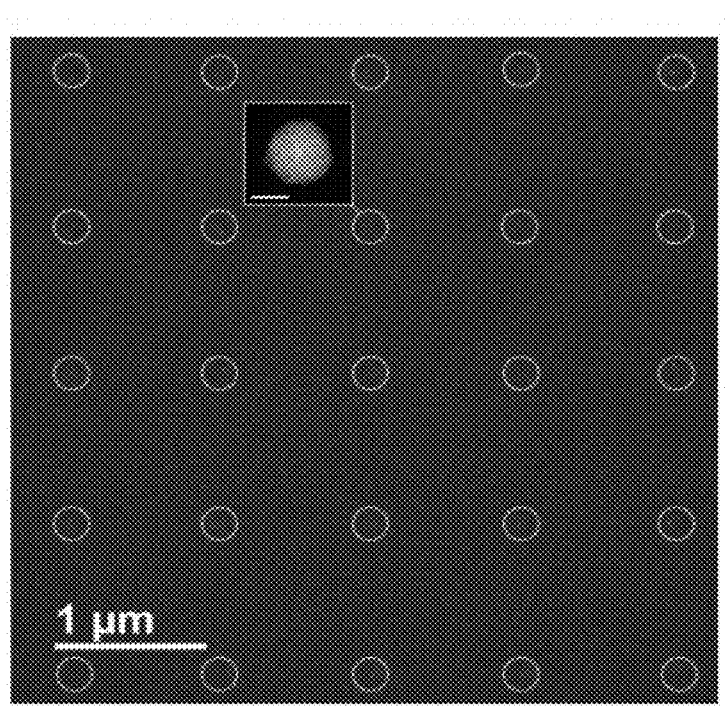
FIG. 5B is an HAADF-STEM image of the 5×5 array of FIG. 5A after thermally annealing in accordance with methods of the disclosure. Dotted circles indicate the size and location of nanoreactors, prior to annealing. Scale bar inset: 3 nm.

For example, as detailed below in the example, tetraphenylporphyrin-poly(ethylene oxide) (TTP-PEO5k, $M_n$=5k) was generated and analyzed to confirm that the PEO chain was functionalized with a single porphyrin molecule. Matrix-assisted laser desorption ionization time-of-flight mass spectrometry (MALDI-TOF MS) characterization was carried out on PEO5k and TPP-PEO5k respectively to characterize the porphyrin metal-free and metal-loaded products. As shown in FIG. 2A, the starting material (PEO5k) has a number-average molecular weight ($M_n$) of 5265 and a small polydispersity index (PDI=1.005). After the coupling reaction, the $M_n$ of polymers increases from 5265 to 5906 and the molecular weight distribution (PDI=1.004) remains similar to PEO5k. The shifting in $M_n$ (641) is consistent with the expected increase in $M_n$ (640.7) that would result from the addition of porphyrin to the PEO. As such, MALDI-TOF MS characterization suggests that the PEO chain was functionalized with single porphyrin molecule.

Methods of the disclosure can further include loading the PEO-porphyrin polymer with a metal. The metal can be one or more of Ni, Cu, Pt, Co, Zn, Fe, Mg, Pd, Mn, Al, Ga, Cr, Sn, Au, Rh, Ru, In, Ag, Mo, Er, Eu, Gd, and Yb.

Metal loading was characterized using UV-Vis spectroscopy. Referring to FIGS. 3A to 3F, the UV-Vis spectra of TPP-PEO5k and metal-loaded TPP-PEO5k. TPP-PEO5k exhibits a strong absorption peak at 418 nm (B band) and four characteristic weak absorption peaks between 500 nm and 750 nm (Q band), which is consistent with the UV-Vis spectrum of tetraphenylporphyrin (TPP, FIGS. 4A-4F). The UV-Vis spectra of polymers change after metal loading. When one compares the UV-Vis spectra of metal-loaded TPP-PEO5k and the spectra of corresponding metalloporphyrins, the shape and position of both Q band and B band peaks are consistent, suggesting that the porphyrin moieties in TPP-PEO5k are completely coordinated with metals to realize single metal atom-functionalized polymers.

Inks formed in accordance with the disclosure can then be used in methods of forming ultra-small nanoparticles through printing of the inks using lithographic methods. Any suitable lithographic methods can be used, including both cantilever tip-based methods, cantilever-free tip-based methods, and tip-array based methods. Such methods include dip pen nanolithography, polymer-pen lithography, and hard tip-soft spring lithography. The method can include depositing the metal-atom functionalized polymer inks onto a substrate to form polymer nanoreactors on the substrate. The polymer nanoreactors can be annealed to form ultra-small nanoparticles on the substrate.

Annealing can be done using a step-wise process in which the annealing temperature is raised from about 150° C. to about 600° C. In embodiments, the process is a two-stage annealing, with the first stage being performed under conditions sufficient to allow for aggregation of the metal ions. For example, the first stage of the annealing process can be performed at a first temperature. For example, the first temperature can be about 100° C. to about 350° C. The annealing can include a second stage performed at a temperature higher than the first temperature and under conditions sufficient to reduce the metal and decompose the polymers to thereby form the nanoparticles. For example, the second stage can be performed at a temperature of about 500° C. to about 600° C. The second stage can be performed for a time of about 12 hours to about 24 hours. The second stage is held for a time sufficient to reduce the metal and decompose the polymer. The first stage can be performed as a multi-step annealing process in which the temperature is ramped between a first temperature range. For example, the first temperature range can be about 100° C. to about 350° C. or any intermediate range there between. For example, the first stage can include a first step that includes heating the polymer nanoreactor at a temperature of about 100° C. to about 200° C. and a second step that heats the polymer nanoreactor at a temperature higher than the first step, for example at a temperature of about 160° C. to about 350° C. The first stage can include any suitable number of annealing steps with increasing temperature for each step within the range of about 100° C. to about 350° C. In other embodiments, the first stage can be a single step annealing at which the printed indicia are held at a single temperature for a time sufficient to allow for aggregation. The single or multiple step annealing process of the first stage can include individual step hold times of about 12 hours to about 24 hours.

For example, in embodiments the annealing can include holding at a first hold temperature of about 160° C., a second hold temperature of about 200° C. and third hold temperature of about 500° C. to about 600° C. The hold at each temperature of the stepwise process can be for about 12 hours to 24 hours. Ramp periods between the hold temperatures for raising to the next elevated hold temperature can be at any suitable rate, for example, temperatures can be ramped between hold temperatures in about 30 min.

Referring to FIGS. 5A-5D, the result of an anneal process in accordance with the disclosure, which is described in detail in the example, illustrates that single nanoparticles are found at the position of each polymer nanoreactor after completing all of the annealing steps. PtTPP-PEO5k was used as the printing ink in this example. Referring to FIGS. 17-20, energy dispersive x-ray spectroscopy (EDS) and x-ray photoelectron spectroscopy (XPS) analysis confirmed that the observed nanoparticles in this example were composed of Pt.

Figure 7A:
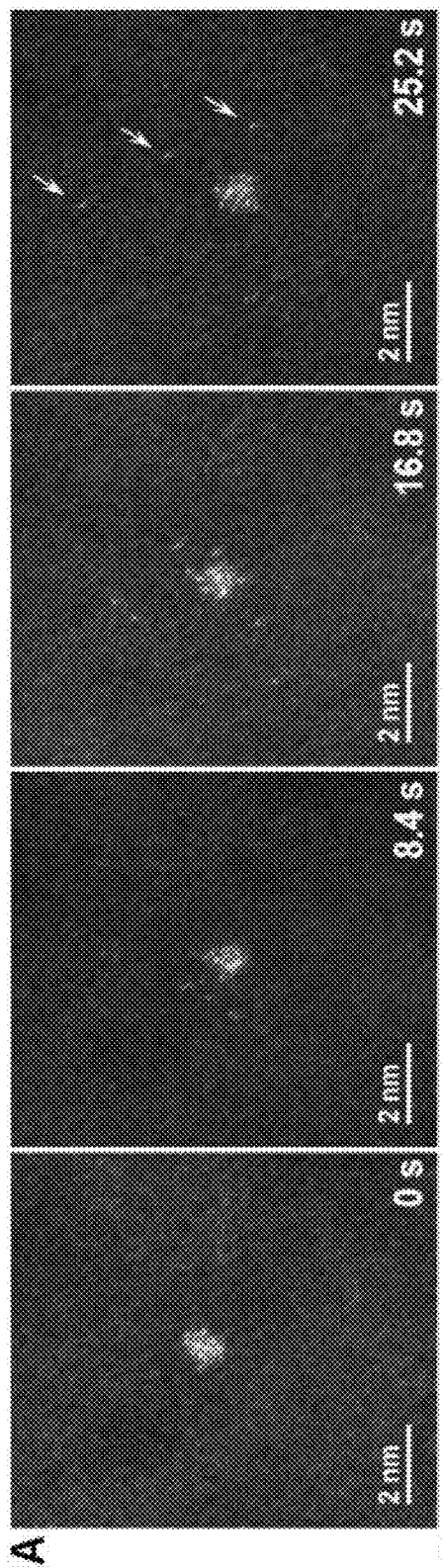
FIGS. 7A and 7B are time-elapsed HAADF-STEM images of two sub-2 nm Pt nanoparticles while being continuously irradiated by electron beam; illustrating that single Pt atoms are continuously dislodged from the Pt nanoparticles when the particles are irradiated (see arrows)
Figure 7B:
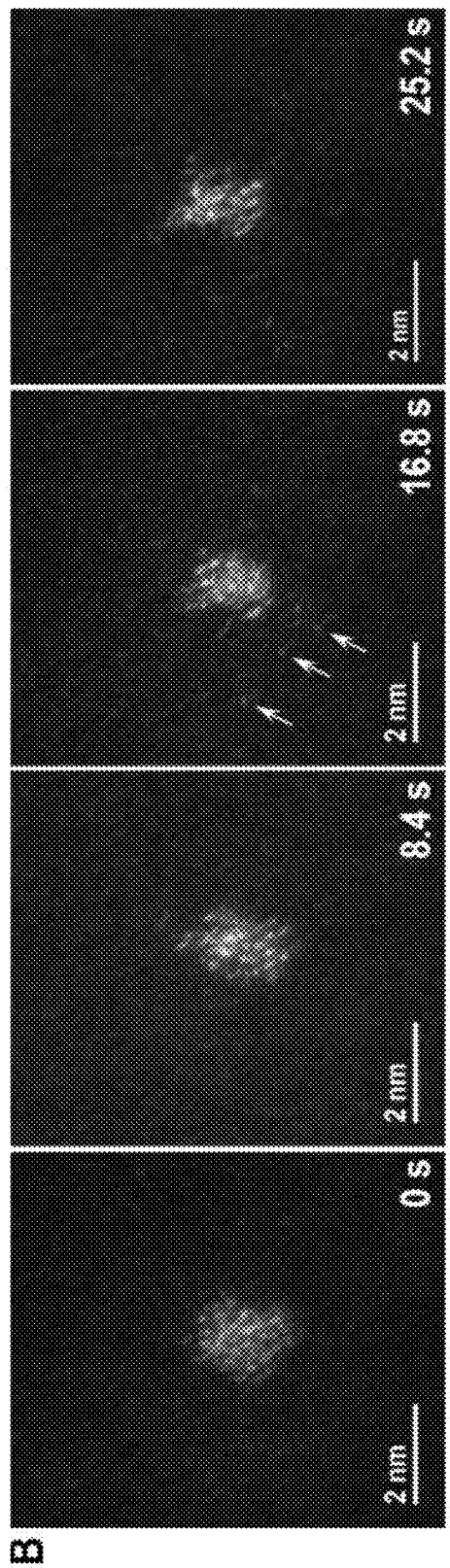

A positive correlation between the size of the printed nanoreactor and the nanoparticle size was found. In general, the nanoreactors can have a diameter (or effective diameter) of at least about 15 nm to about 330 nm, about 100 nm to about 300 nm, about 15 nm to about 50 nm, about 30 nm to about 150 nm, about 75 nm to about 250 nm, about 15 nm to about 45 nm, or about 60 nm to about 250 nm. Other suitable nanoreactor diameters include about 15, 20, 25, 30, 35, 40, 45, 50, 55, 60, 65, 70, 75, 80, 85, 90, 95, 100, 110, 120, 130, 140, 150, 160, 170, 180, 190, 200, 210, 220, 230, 240, 250, 260, 270, 280, 290, 300, 310, 320, or 330 nm. It has been found that ultra-small nanoparticles (having sub-2 nm diameters) can be formed from nanoreactors having a diameter of about 35 nm to less. Methods of the disclosure can suitably print nanoreactors at sizes less than 20 nm and result in ultra-small nanoparticles, however, it was found that at nanoreactors size less than 20 nm, it is challenging to accurately measure the size of the resulting ultra-small nanoparticle because the nanoparticles are unstable under an electron beam, which results in images with irregular particle shapes. FIGS. 6A-6C illustrate this for a Pt ultra-small nanoparticle formed from a polymer nanoreactor having a diameter of less than 20 nm. In addition to the structural instability, single Pt atoms are continuously from the Pt nanoparticles when the particles are irradiated by an electron beam (FIGS. 7A and 7B). Since the overall number of Pt atoms is less than 50 in this scenario, the dislodged atoms become non-negligible when evaluating the particle size.

Figure 8A:
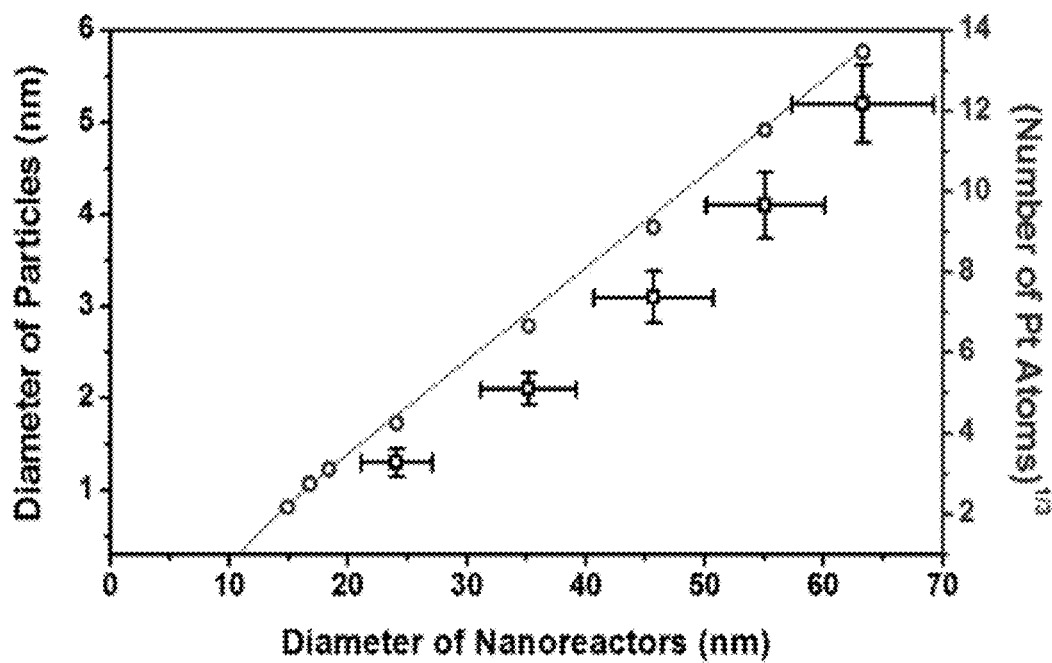
FIG. 8A is a graph comparing the size of deposited nanoreactors, the size of resulting nanoparticles, and the theoretical number of metal atoms in each nanoreactor.
Figure 8B:
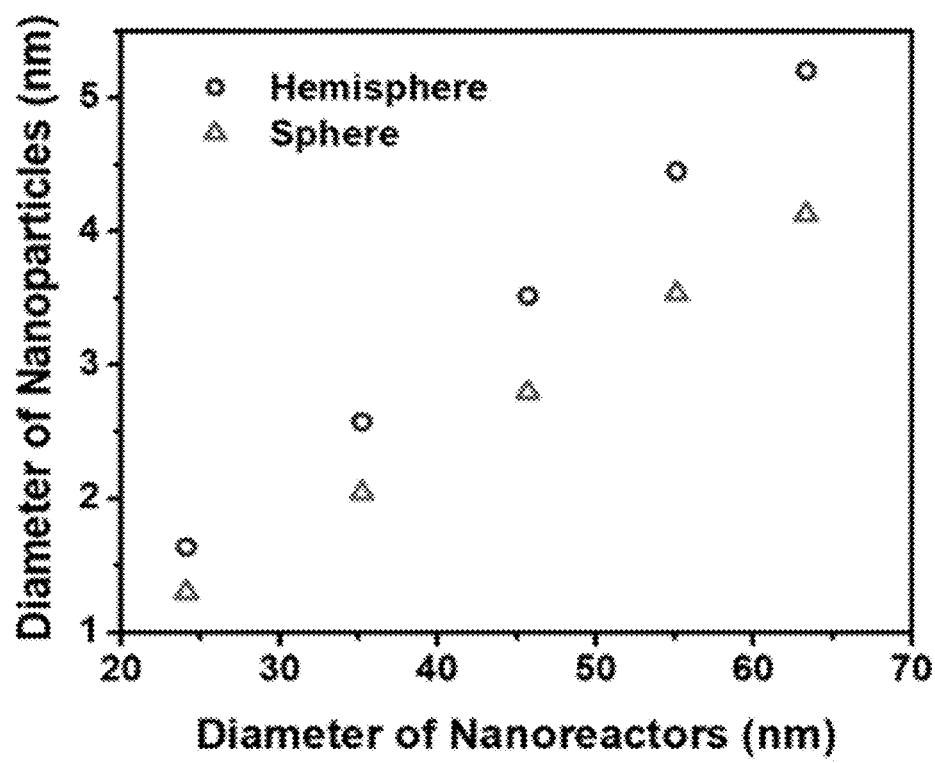
FIG. 8B is a graph showing the theoretical diameter of Pt nanoparticles (sphere or hemisphere) with a given number of Pt atoms. The Seitz radius of Pt atom (0.153 nm) is used to calculate the diameter of nanoparticles.
Figure 9A:
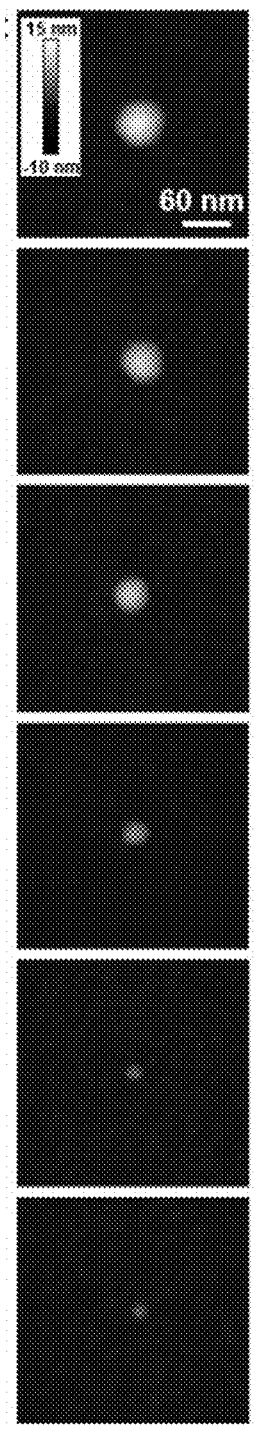
FIG. 9A is an AFM topographical image of polymer nanoreactors with diameters ranging from 65 nm to less than 20 nm.
Figure 9B:
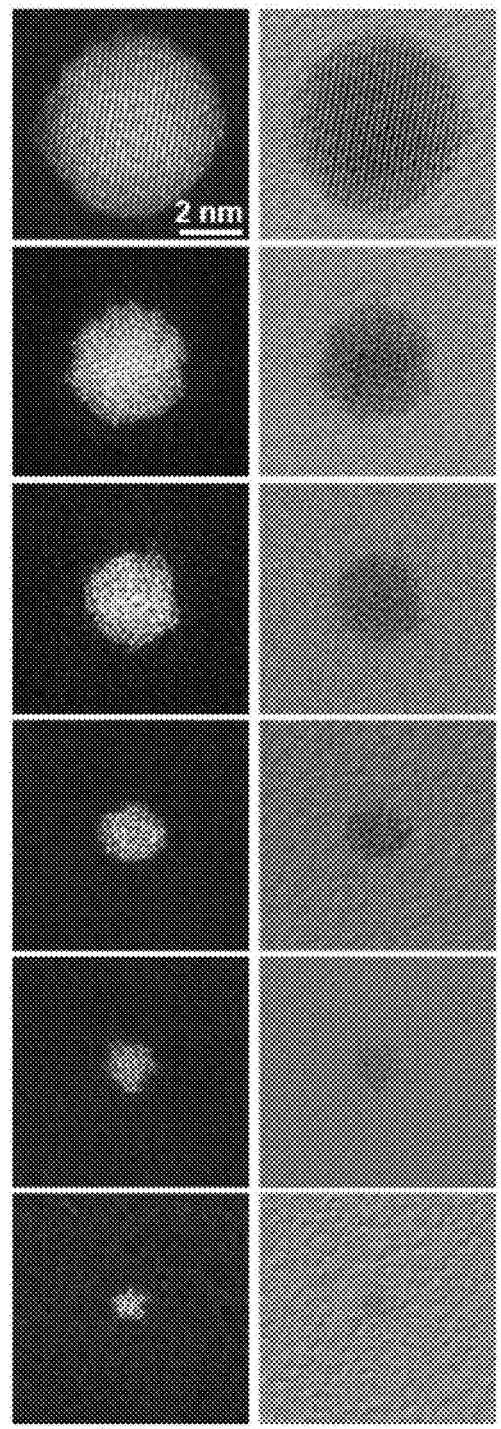
FIG. 9B are HAADF-STEM and BF-STEM images of nanoparticles obtained from the nanoreactors of FIG. 9A using methods in accordance with the disclosure; the nanoparticle diameters range from 5 nm to less than 1 nm.
Figure 13A:
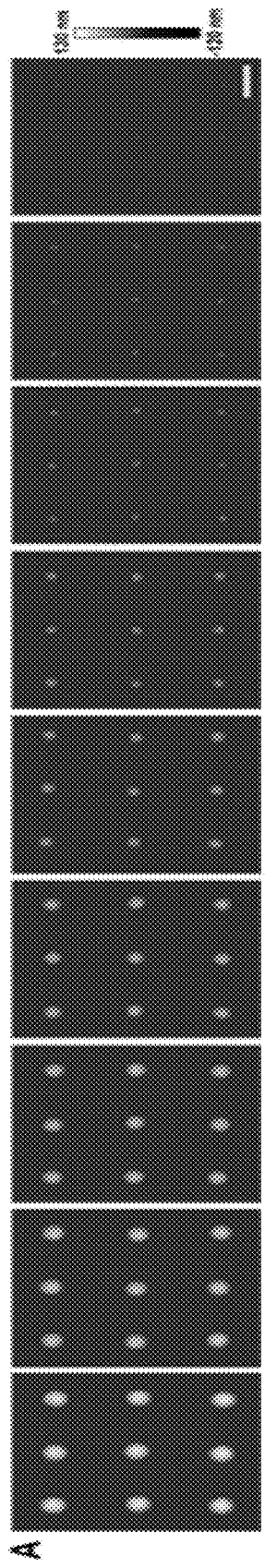
FIG. 13A is AFM topographical images of 3×3 arrays of polymer nanoreactors with diameters ranging from 330 to 75 nm.
Figure 13B:
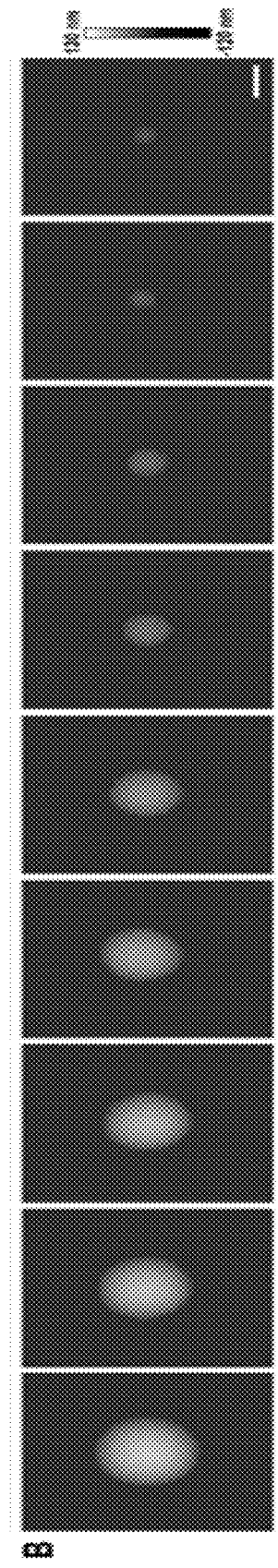
FIG. 13B is zoomed-in AFM topographical images of one polymer nanoreactor from each array shown in FIG. 13A.
Figures 13C, 13D:
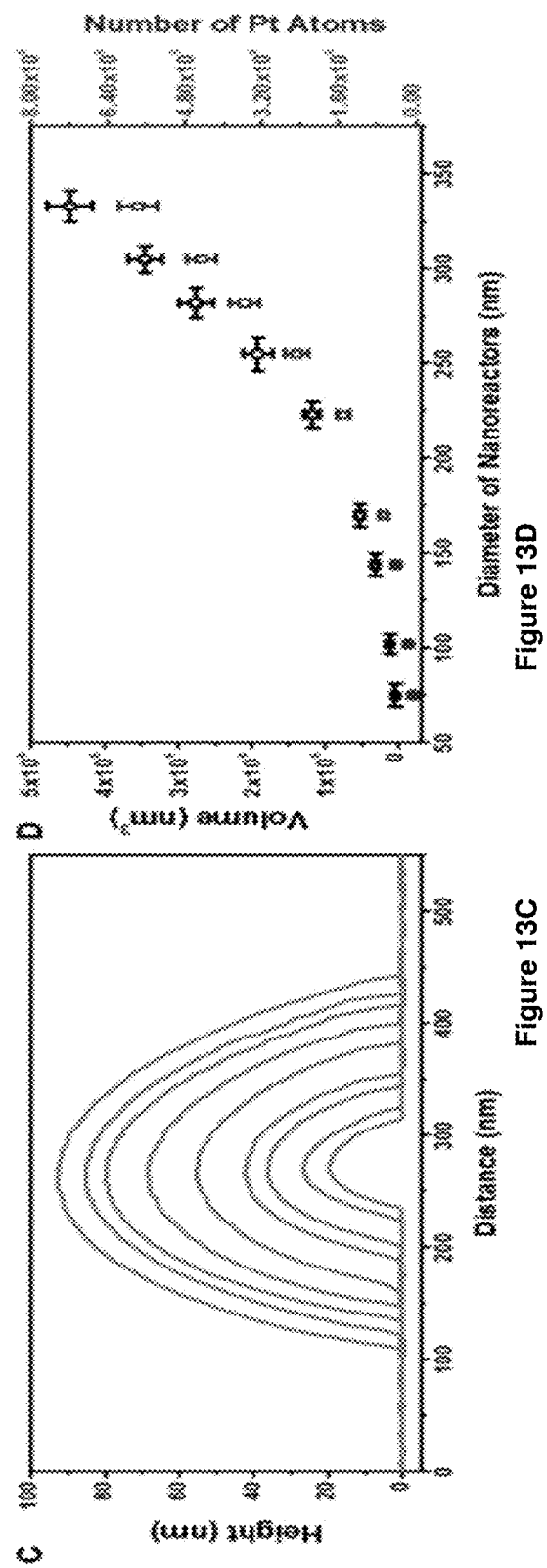
FIG. 13C is a graph illustrating height profiles of the polymer nanoreactors shown in FIG. 13B.
FIG. 13D is a graph showing the correlation between the diameter of polymer nanoreactors, the volume of nanoreactors, and the theoretical number of metal atoms in each nanoreactor.
Figure 14A:
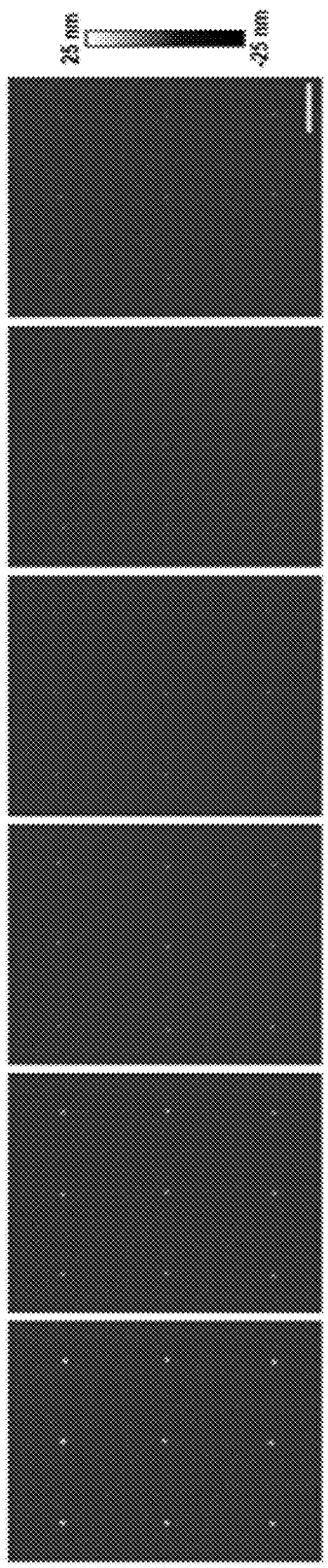
FIG. 14A is AFM topographical images of 3×3 arrays of polymer nanoreactors with diameters ranging from 75 to 20 nm.
Figure 14B:
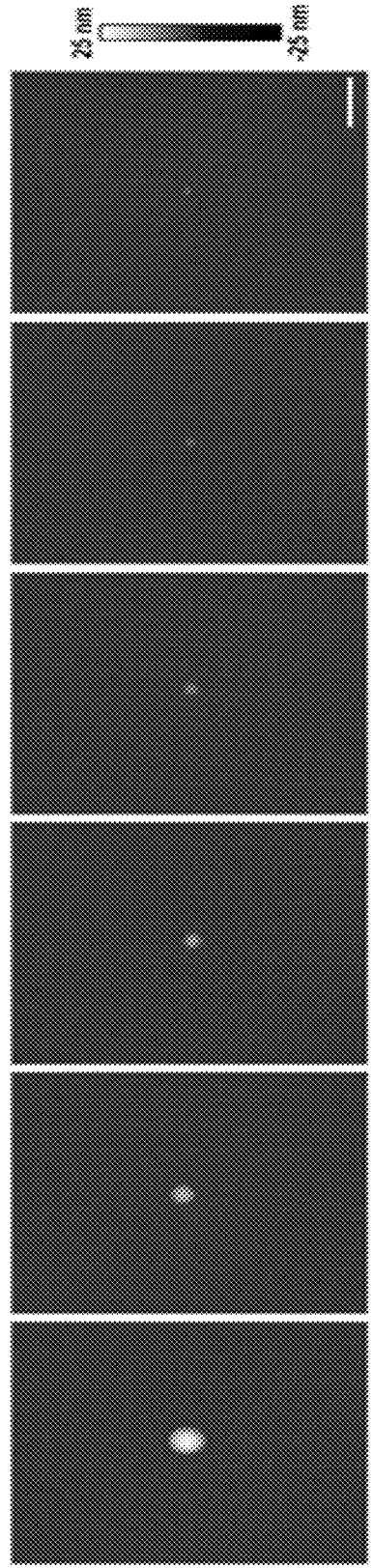
FIG. 14B is zoomed-in AFM topographical images of one polymer nanoreactor from each array shown in FIG. 14A.
Figure 15A:
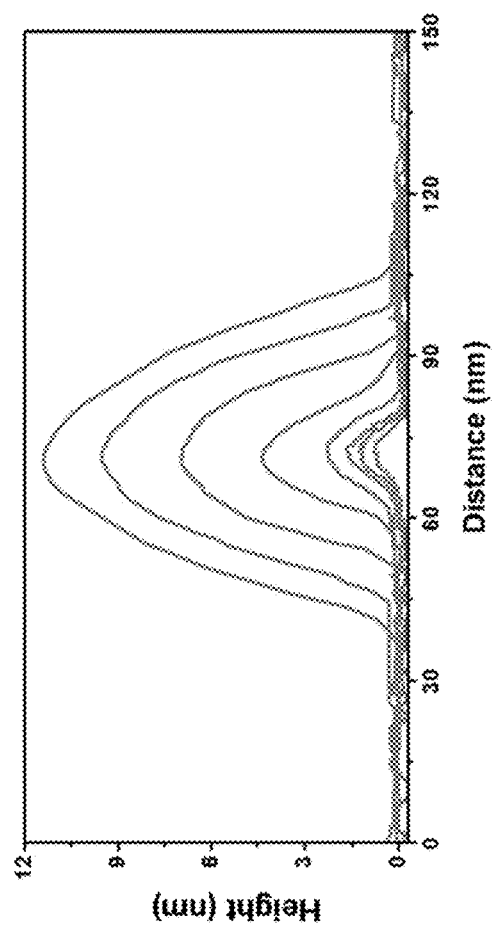
FIG. 15A is a graph illustrating height profiles of the polymer nanoreactors with diameters ranging from 65 to 15 nm.
Figure 15B:
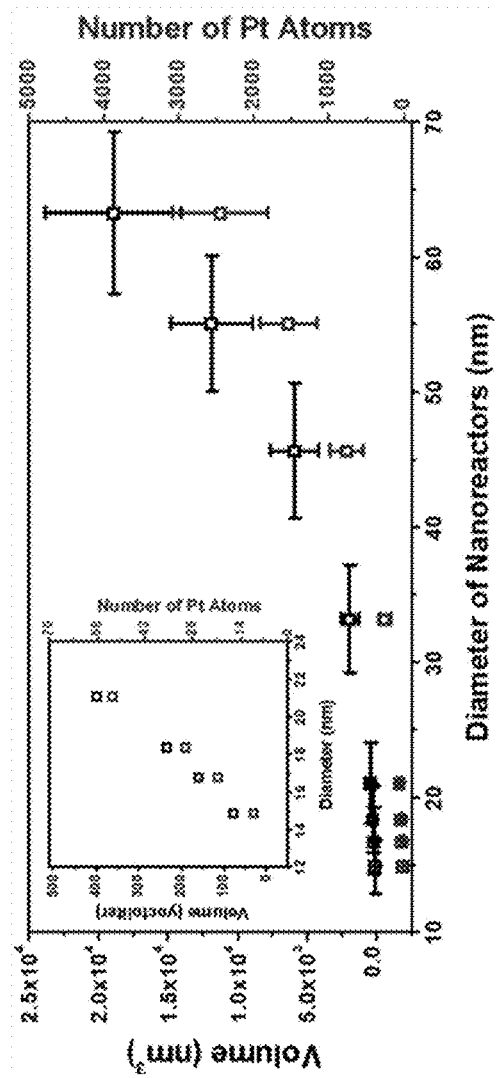
FIG. 15B is a graph showing the correlation between the diameter of polymer nanoreactors, the volume of nanoreactors, and the theoretical number of metal atoms in each nanoreactor in FIG. 15A.
Figure 16:
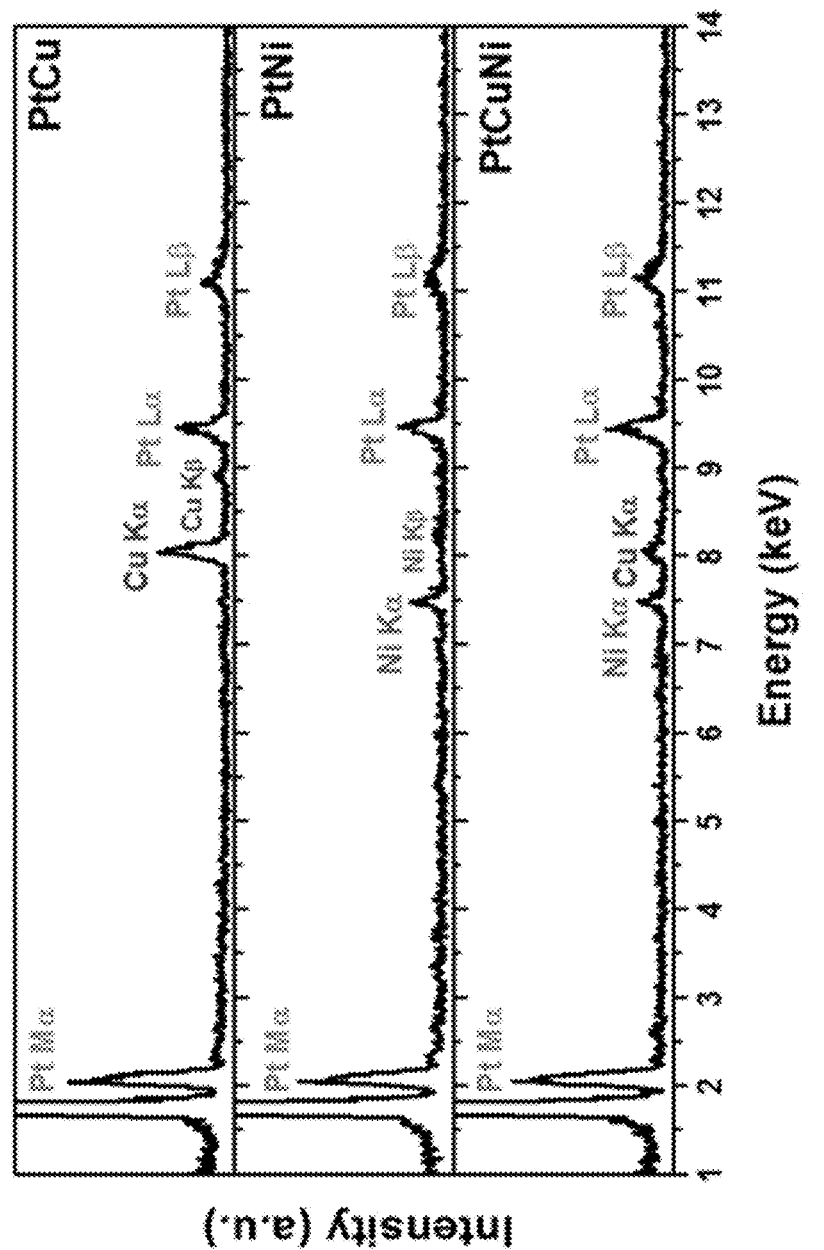
FIG. 16 is an EDS spectra of the alloy nanoparticles shown in FIGS. 11A, 11B, and 12.
Figure 17A:
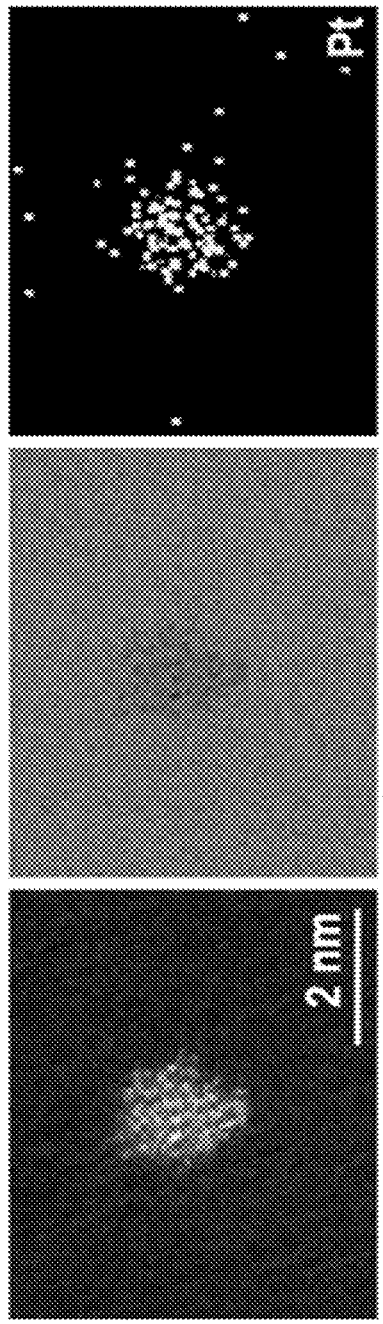
FIG. 17A are corresponding HAADF-STEM image, BF-STEM image, and elemental mapping of a sub-2 nm Pt nanoparticle.
Figure 17B:
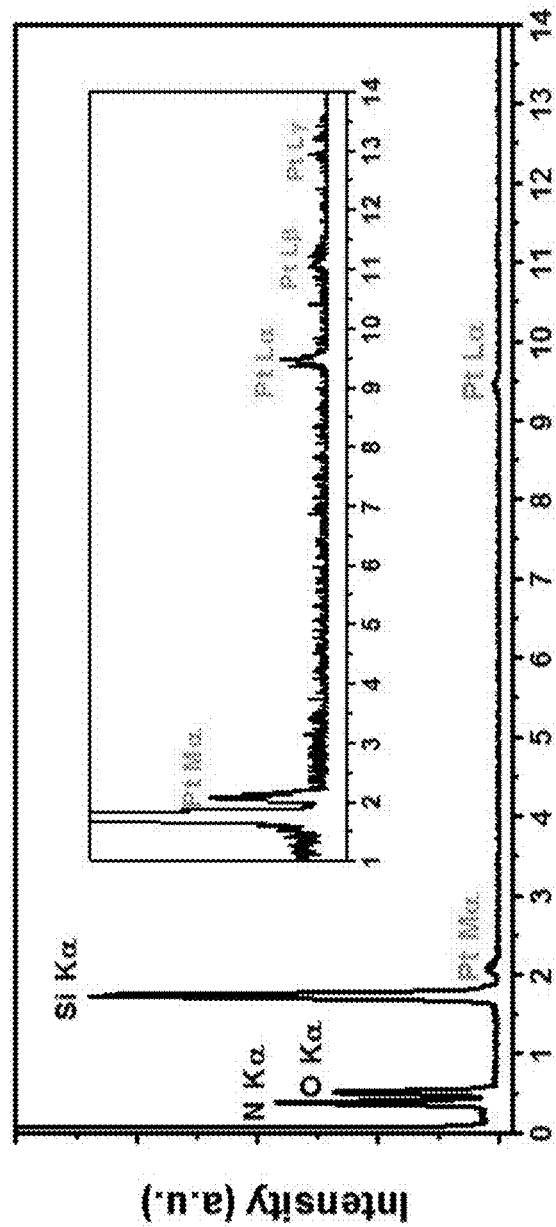
FIG. 17B is EDS spectrum of the Pt nanoparticle of FIG. 17A; the N and Si signals are background signals from the SiN, TEM grids.

The size correlation was demonstrated with Pt ultra-small particles and it was found that the size resulting from the methods of the disclosure corresponds to the theoretical size range. Such correlation is expected for other metal ultra-small particles formed using the methods of the disclosure. FIGS. 8A and 8B illustrate the theoretical particle size of Pt ultra-small nanoparticles as a function of nanoreactor size and number of Pt atoms. For instance, an about 35 nm polymer nanoreactor that contains about 295 Pt atoms should yield either a Pt sphere with a diameter of 2.0 nm or a Pt hemisphere with a diameter about 2.5 nm FIGS. 9A and 9B illustrate the size correlation between nanoreactor size and nanoparticle size for nanoreactors ranging from diameters of 65 nm to less than 20 nm. FIG. 9A is AFM topographical images of the polymer nanoreactors and FIG. 9B are HAADF-STEM and BF-STEM images of the resulting nanoparticles after annealing the nanoreactors in accordance with methods of the disclosure. FIGS. 13A-13D further illustrate the correlation between nanoreactor size and theoretical number of metal atoms in each nanoreactor from nanoreactors having a size from 330 nm to 75 nm using methods in accordance with the disclosure. FIG. 13A illustrates 3×3 arrays of the polymer nanoreactors and FIG. 13B is a zoomed in image of individual nanoreactors from each array. FIG. 13C illustrates the high profiles of the nanoreactors shown in FIG. 13B and FIG. 13D shows the correlation between the diameter of the polymer nanoreactors, the volume of the nanoreactors, and the theoretical number of atoms in each reactor.

Figure 10:
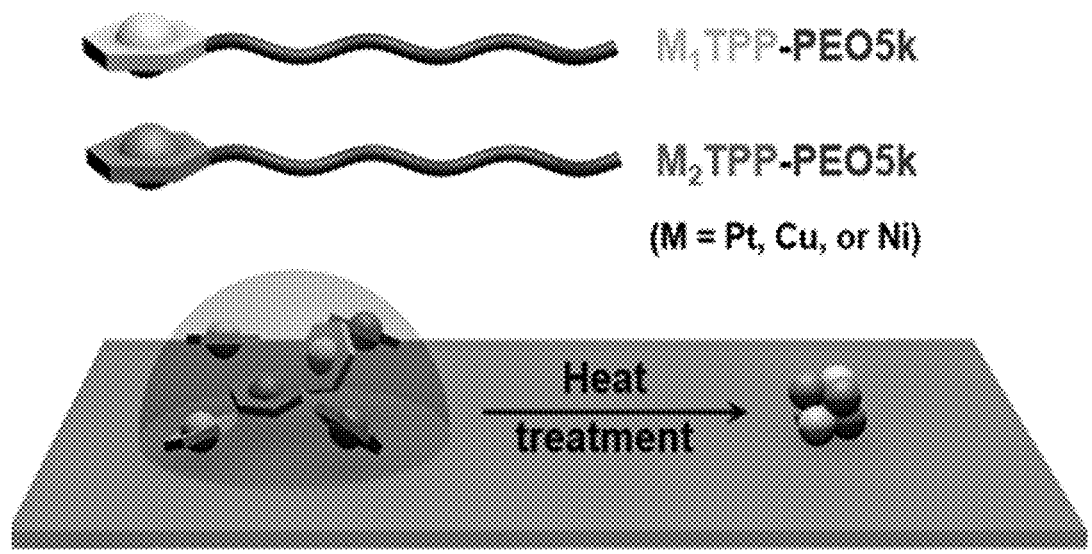
FIG. 10 is a schematic illustration of methods of the disclosure using mixed metalloporphyrin-terminated polymers as a printing ink for forming alloyed nanoparticles.
Figure 11A:
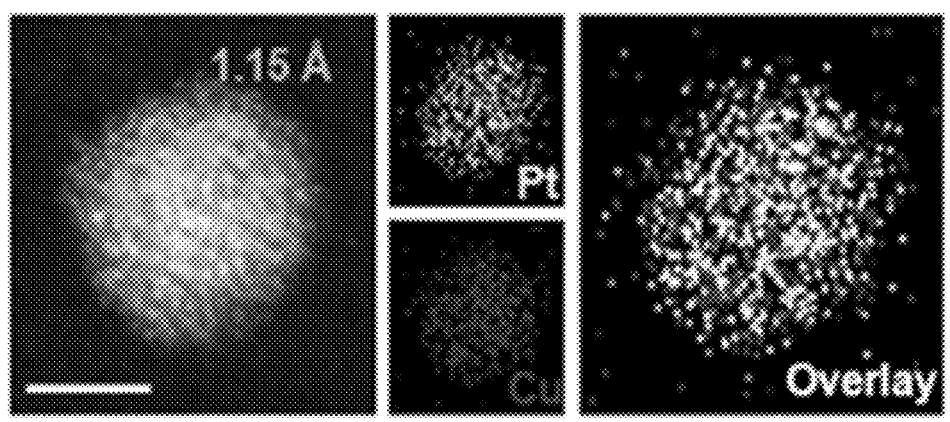
FIG. 11A is an HAADF-STEM image and corresponding EDS elemental maps of PtCu ($Pt_{0.41}Cu_{0.59}$), nanoparticles synthesized from mixtures of metalloporphyrin-terminated PEO polymers in accordance with the disclosure; scale bar in HAADF-STEM image is 2 nm.
Figure 11B:
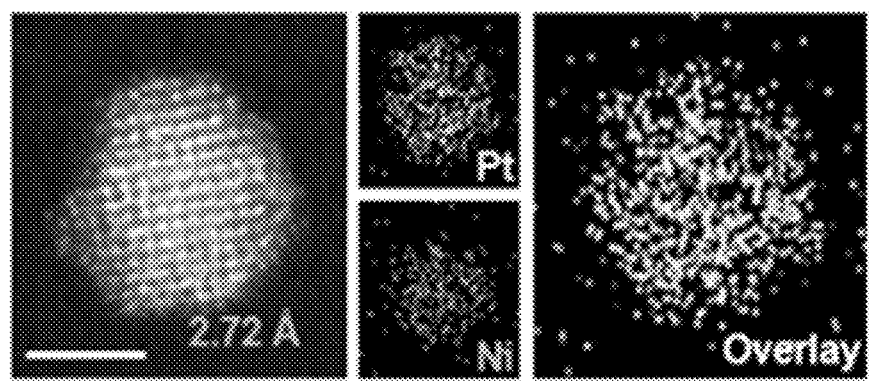
FIG. 11B is an HAADF-STEM image and corresponding EDS elemental maps of PtNi ($Pt_{0.59}Ni_{0.41}$), nanoparticles synthesized from mixtures of metalloporphyrin-terminated PEO polymers in accordance with the disclosure; scale bar in HAADF-STEM image is 2 nm.
Figure 12:
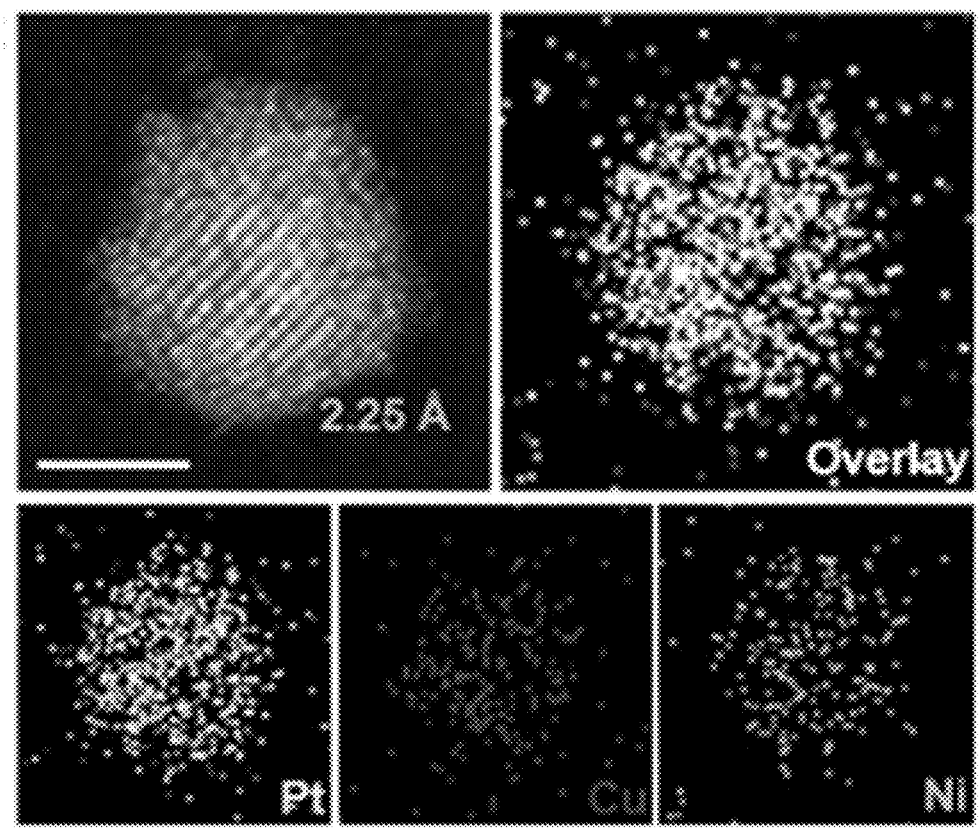
FIG. 12 is an HAADF-STEM image and corresponding EDS elemental maps of PtCuNi ($Pt_{0.62}Cu_{0.19}Ni_{0.19}$), nanoparticles synthesized from mixtures of metalloporphyrin-terminated PEO polymers in accordance with the disclosure; scale bar in HAADF-STEM image is 2 nm.

Referring to FIG. 10, methods of the disclosure can also be used for forming polyelemental nanoparticles using mixed metalloporphyrin-terminated polymers. For example, a polymer ink can be prepared using mixtures of metalloporphyrin terminated polymers, wherein the polymers are loaded with different metals. For example, the ink can include a first metalloporphyrin terminated polymer having metal $M_1$ and a second metalloporphyrin polymer having metal $M_2$, wherein $M_1$ and $M_2$ are each independently selected form Pt, Cu, Ni, Co, Zn, Fe, Mg, Pd, Mn, Al, Ga, Cr, Sn, Au, Rh, Ru, In, Ag, Mo, Er, Eu, Gd, or Yb. Any suitable number of metalloporphyrin terminated polymers can be used depending on the desired alloyed nanoparticle to be formed. Referring to FIGS. 11A and 11B, for example, CuTPP-PEO5k can be mixed with PtTPP-PEO5k to form PtCu alloy nanoparticles or NiTPP-PEO5k can be mixed with PtTPP-PEO5k to form PtNi alloy particles, mixing the metalloporphyrin terminated polymers in a 1:1 ratio. Trimetallic nanoparticles can also be formed. Referring to FIG. 12, for example, CuTPP-PEO5k can be mixed with PtTPP-PEO5k and NiTPP-PEOSK to form PtCuNi trimetallic nanoparticles. Such trimetallic nanoparticles can be formed for example using a ratio of 2:1:1 PtTPP-PEO5k:CuTPP-PEO5k:NiTPP-PEO5k. Any suitable mixture can be determined based on the desired alloyed nanoparticle. The mixtures of metalloporphyrin terminated polymers can be combined for example in equal parts or in various molar ratios depending on the resulting alloy desired.

In any of the embodiments herein, the nanoparticles and ultra-small nanoparticles of the disclosure can be oxidized after formation. For example, an oxide shell can be formed by exposing the nanoparticles to an electron beam or by annealing the nanoparticle in air or oxygen.

The resulting nanoparticles and ultra-small nanoparticles prepared by the methods disclosed herein can be used in a variety of end uses. For example, the nanoparticles and ultra-small nanoparticles can be used in catalyzing various chemical reactions, including hydrogenation, carbon dioxide reduction, nitrogen reduction, hydrogen oxidation, methanol oxidation, and ethanol oxidation. The nanoparticles and ultra-small nanoparticles can be used for various optical applications including in light harvesting, as light-sensitive sensors and in bioimaging.

EXAMPLE

Chemicals. 5,10,15-Triphenyl-20-(4-carboxyphenyl) porphyrin was prepared according to literature procedures. (48) Methoxy-poly(ethylene oxide) amine (mPEO-NH$_2$, Mn=5000 g/mol, polydispersity index=1.01) was purchased from Alfa Aesar, Inc. Metal compounds (>99.9% trace metal basis), platinum(II) chloride, copper(II) acetate, nickel(II) acetate tetrahydrate, cobalt(II) acetate, and zinc(II) acetate were purchased from Sigma-Aldrich, Inc. and used without further purification. Heptadecafluoro-1,1,2,2-tetrahydrodecyltrichlorosilane (fluorosilane) was purchased from Gelest, Inc. Cobalt(II) tetraphenylporphyrin, nickel(II) tetraphenylporphyrin, Cu(II) tetraphenylporphyrin, Zn(II) tetraphenylporphyrin, and Pt(II) tetraphenylporphyrin were purchased from Frontier Scientific, Inc. All other chemicals and anhydrous solvents were purchased from Sigma-Aldrich, Inc. and used as received. Dialysis membranes (1K MWCO) were purchased from Spectrum Laboratories, Inc. Atomic force microscopy (AFM) multi-contact 1D probes (type M, no gold coating) were purchased from Advanced Creative Solutions Technology, Inc. Silicon TEM grids with 5 or 10 nm silicon nitride support films were purchased from SiMPore, Inc.

Synthesis of metalloporphyrin-functionalized polymers. Tetraphenylporphyrin-poly(ethylene oxide) (TPP-PEO5k). 5,10,15-Triphenyl-20-(4-carboxyphenyl) porphyrin (10 mg, 0.0152 mmol), hexafluorophosphate azabenzotriazole tetramethyl uronium (HATU, 11.54 mg, 0.0304 mmol), and mPEO-NH$_2$ (63.25 mg, 0.01265 mmol) were added to DMF (5 mL) under N$_2$, and the mixture was stirred for 20 min at room temperature. Then, N,N-diisopropylethylamine (DIPEA, 10 µL, 0.0506 mmol) was added. The resulting mixture was stirred at room temperature for 24 h and the reaction was quenched with brine. The mixture was extracted with DCM, and then dried over Na$_2$SO$_4$. The solvent was removed under reduced pressure, and the resulting residue was purified by size-exclusion chromatography on Sephadex™ LH-20 (methanol) to afford the desired polymer TPP-PEO5k in 74% yield (52.8 mg, 0.00936 mmol).

CuTPP-PEO5k. TPP-PEO5k (8 mg) and Cu(OAc)$_2$ (8 mg) were added to DMF (1 mL) under N$_2$, and the resulting mixture was stirred at 80° C. for 24 h. Completion of the reaction was monitored by UV-Vis measurement. The solvent was removed under vacuum, and the resulting residue was purified by dialysis in a DMF and H$_2$O mixture (1:1, v/v) for 3 days and then in H$_2$O for another 5 days to afford the desired CuTPP-PEO5k.

CoTPP-PEO5k. TPP-PEO5k (8 mg) and Co(OAc)$_2$ (11.2 mg) were added to DMF (1 mL) under N$_2$, and the resulting mixture was stirred at 80° C. for 24 h. Completion of the reaction was monitored by UV-Vis measurement. The solvent was removed under vacuum, and the resulting residue was purified by dialysis to afford the desired CoTPP-PEO5k.

NiTPP-PEO5k. TPP-PEO5k (7 mg) and Ni(OAc)$_2$.4H$_2$O (10 mg) were added to DMF (1 mL) under N$_2$, and the resulting mixture was stirred at 80° C. for 24 h. Completion of the reaction was monitored by UV-Vis measurement. The solvent was removed under vacuum, and the resulting residue was purified by dialysis to afford the desired NiTPP-PEO5k.

ZnTPP-PEO5k. TPP-PEO5k (10 mg) and Zn(OAc)$_2$ (10 mg) were added to DMF (1 mL) under N$_2$, and the resulting mixture was stirred at 80° C. for 24 h. Completion of the reaction was monitored by UV-Vis measurement. The solvent was removed under vacuum, and the resulting residue was purified by dialysis to afford the desired ZnTPP-PEO5k.

PtTPP-PEO5k. 5,10,15-Triphenyl-20-(4-carboxyphenyl) porphyrin (16 mg, 0.0243 mmol) and PtCl$_2$ (10 mg, 0.0376 mmol) were added to PhCN (2 mL) under N$_2$, and the resulting mixture was stirred at 188° C. for 24 h. Completion of the reaction was monitored by UV-Vis measurement. The solvent was removed under vacuum to afford the crude Pt-loaded porphyrin, and the crude product was carried to next step without further purification. The crude Pt-loaded porphyrin was then added to a DMF solution (1 mL) of HATU (10 mg, 0.026 mmol) and mPEO-NH$_2$ (100 mg, 0.02 mmol) under N$_2$. The mixture was stirred for 20 min at room temperature, and then DIPEA (7 μL, 0.04 mmol) was added. The resulting mixture was stirred at room temperature for 24 h, and the solvent was removed under vacuum. The resulting residue was purified by size-exclusion chromatography on Sephadex™ LH-20 (methanol) and then by dialysis to afford the desired polymer PtTPP-PEO5k in 78% yield (93.4 mg, 0.016 mmol).

Preparation of polymer ink solution. Two types of ink solution, i.e., aqueous ink and acetonitrile ink, were used for printing. Aqueous ink solution was prepared by dissolving MTPP-PEO5k (M refers to metal) and glycerol in de-ionized water. The ink solution had a polymer concentration of 2 mg/mL and a mass ratio of 100:1 between MTPP-PEO5k and glycerol. The ink solution was stirred at room temperature for 24 h prior to use. Acetonitrile polymer ink solution was prepared by dissolving MTPP-PEO5k in acetonitrile with a concentration of 5 mg/mL and stirred at room temperature for 24 h prior to use.

Nanocluster synthesis. Hydrophobic TEM grids were first obtained by placing the grids in a vacuum desiccator that contained a vial of a fluorosilane and toluene mixture (1:9, v/v). To print polymer nanoreactors with diameters >80 nm, AFM 1D probes were mounted onto a Park XE-150 AFM, dip-coated with aqueous ink solution, and then brought into contact with the hydrophobic TEM grids to deposit polymers. The patterning process was performed in a chamber at a controlled temperature of 25° C. and relative humidity (R.H.) of 90%. To print polymer nanoreactors with diameters <80 nm, the AFM 1D probes were first dip-coated with acetonitrile ink solution and allowed to dry under ambient conditions. Following inking, the probes were mounted onto the Park AFM and incubated in the wet chamber (25° C., 90% R.H.) for 1 h. After that, the probes were brought into contact with the hydrophobic TEM grids to deposit polymers. To convert polymer nanoreactors into nanoclusters, the TEM grids were thermally annealed under flowing H$_2$ in a tube furnace. Typical annealing conditions were as follows: ramp to 150° C. in 30 min, hold at 160° C. for 12 h, ramp to 200° C. in 30 min, hold at 200° C. for 12 h, ramp to 500 or 600° C. in 2 h, thermally anneal the grids at 500 or 600° C. for 18 h, and finally cool down to room temperature in 0.5 h.

Characterization. Matrix-assisted laser desorption ionization time-of-flight mass spectrometry (MALDI-TOF MS) were performed on a Bruker AutoFlex-III instrument in reflection-positive mode. Samples were drop-casted with 2,5-Dihydrozybenzoic acid (DHB) on a coin chip for MALDI-TOF measurements. UV-Vis absorption spectra were recorded at room temperature on an Agilent Cary 60 UV-Vis spectrophotometer using a 10 mm cell-path quartz cuvette. Atomic force microscopy (AFM) characterization of the polymer nanoreactors were performed on a Bruker Dimension Icon atomic force microscope. Thermogravimetric analysis coupled with gas chromatography-mass spectrometry (TGA/GC-MS, Netzsch Jupiter STA 449 F3 coupled with Agilent 5975 GC-MS) was used to study thermal decomposition of porphyrin-functionalized PEO. The measurement was performed under helium with a ramping rate of 10.0° C./min. Scanning transmission electron microscopy (STEM) characterization of the nanoparticles were performed on a JEOL ARM200CF transmission electron microscope at an acceleration voltage of 200 kV. The transmission electron microscope is equipped with two EDS detectors (silicon drift detector, SDD). Each EDS detector has a solid angle of −0.86 steradians. The bright-field images were recorded using a bright-field detector and the dark-field images were taken with a high-angle annular dark-field (HAADF) detector. Nanoparticle composition was studied using the equipped dual EDS detectors on JEOL ARM200CF TEM with a 200 kV acceleration voltage. The Lα peaks of Pt, and the Kα peaks of Ni and Cu in the EDS spectra were used for elemental mapping and for composition quantification. Atomic compositions of the nanoparticles are calculated using standardless Cliff-Lorimer correction method. The atomic composition measured by EDS has an inherent error of less than 5% due to x-ray absorption and fluorescence. Each EDS map is built based on 30 frames with pixel dwell time of 203 μs. X-ray photoelectron spectroscopy (XPS) spectra were recorded on a Thermo Scientific ESCALAB 250Xi x-ray photoelectron spectroscope with samples made by drop-casting.

XPS Analysis of Polymer Residues and Nanoparticles

Figure 18:
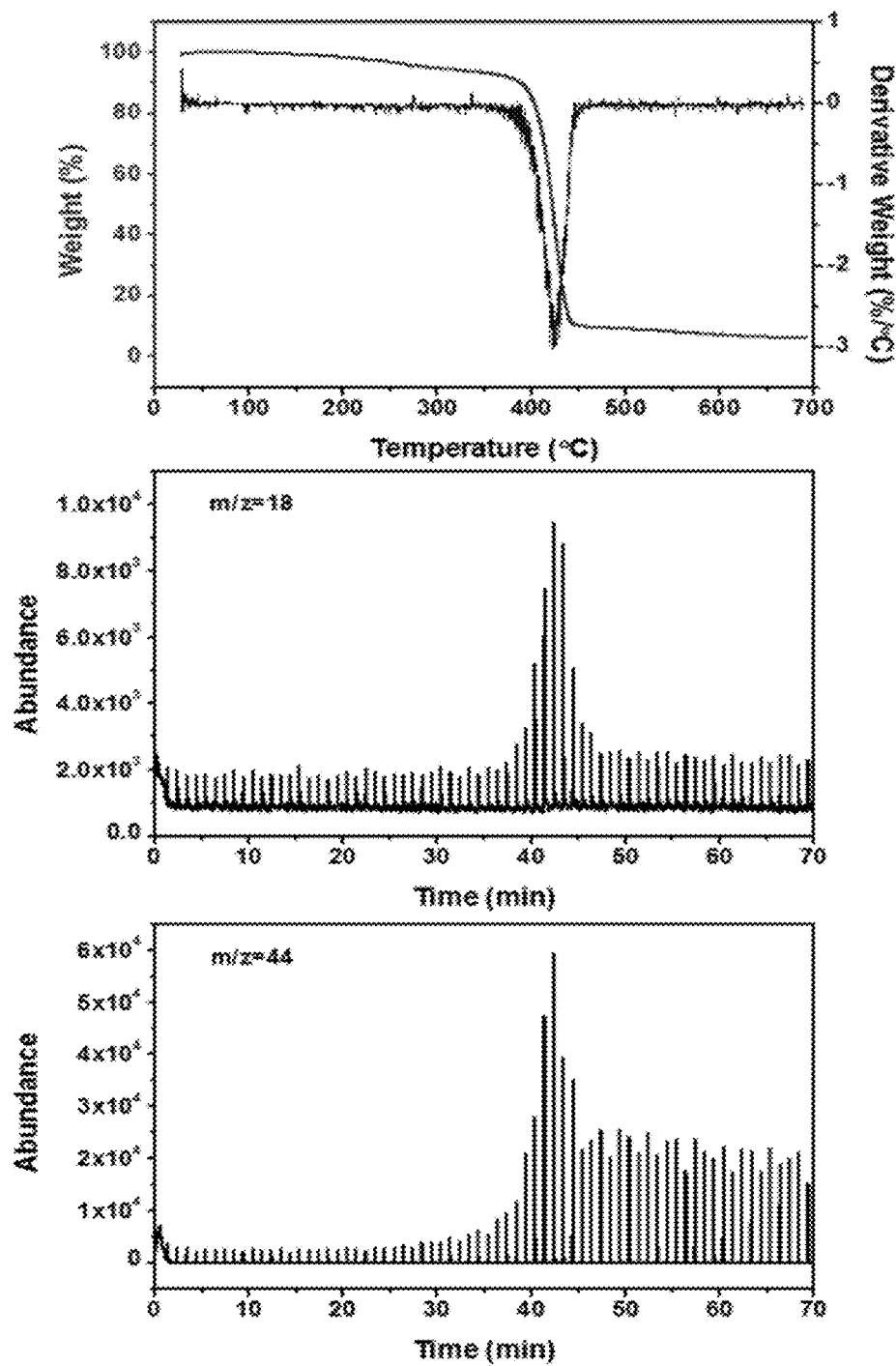
FIG. 18 is a thermal decomposition analysis of TPP-PEO5k showing that the two main decompositions products are water (m/z=18) and carbon dioxide (m/z=44)
Figures 19A, 19B, 19C:
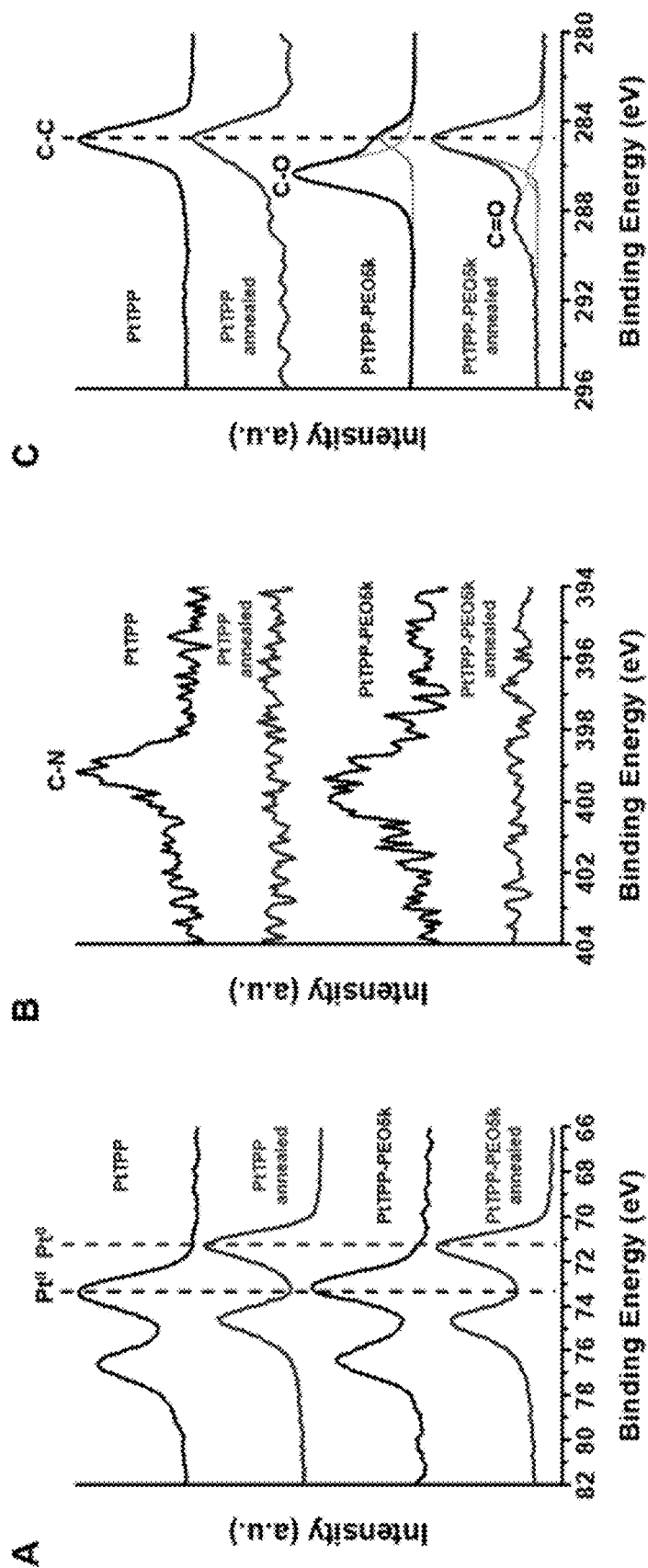
FIGS. 19A-19C are Pt 4f, N 1s, and C 1s XPS spectra of PtTPP and PtTPP-PEO5k samples drop-cast on Si substrates (black lines), and XPS spectra of the same samples after being thermally annealed.
Figure 20:
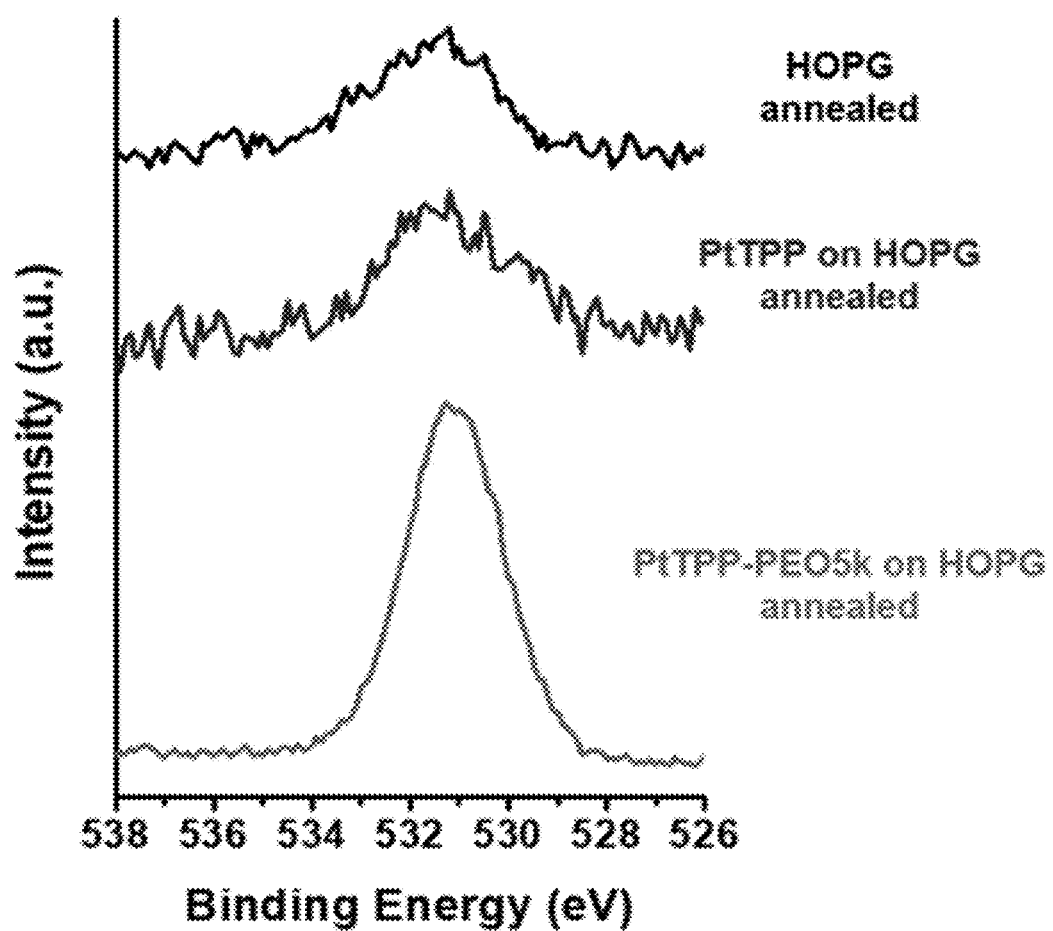
FIG. 20 is an O 1s XPS spectra of samples made by thermally annealing a HOPG substrate, drop-casting PtTPP on HOPG followed by thermal annealing, and drop-casting PtTPP-PEO5k on HOPG followed by thermal annealing.

To understand the chemical fate of polymers and metals after thermal annealing, thermogravimetric analysis coupled with gas chromatography-mass spectrometry was first performed on TPP-PEO5k. The results indicated that the majority (>90%) of polymers decomposed at temperatures below 500° C. with water and carbon dioxide as the main by-products (FIG. 18). X-ray photoelectron spectroscopy (XPS) was also performed on drop-cast PtTPP and PtTPP-PEO5k samples to examine the residue of the decomposed polymer. As shown in FIG. 19, the N 1s peak (399.3 eV), that can be found in the PtTPP-PEO5k sample, disappeared after thermal treatment, suggesting a negligible amount of N remains in the annealed samples. The C 1s spectrum of PtTPP-PEO5k can be deconvoluted into two peaks at 286.4 and 284.8 eV, which are ascribed to the carbon in C—O bonds and C—C bonds, respectively. After thermally annealing PtTPP-PEO5k, the relative intensity of C—O peak decreases as compared to C—C peak, while a new peak (288.5 eV) belonging to the carbon in C=O bonds appear. Meanwhile, the O 1s XPS spectra of the annealed PtTPP-PEO5k samples show increased O signal as compared to the control samples (FIG. 20). Based on these XPS measurements, it is clear that the residue of polymer decomposition is mainly composed of carbon and oxygen with negligible amount of nitrogen. Pt $4f_{7/2}$ spectrum were also recorded to trace the oxidation state of Pt during the synthesis process. For pristine PtTPP and PtTPP-PEO5k samples, the Pt $4f_{7/2}$ peaks that belong to the Pt in porphyrin molecules are at 73.3 eV, which is within the expected range for $Pt^{II}$ (FIG. 19). This peak shifts to 71.3 eV after thermal annealing, indicating that the resulting Pt nanoparticles are in a metallic state.

Formation of Oxide Shells on Ultra-Small Polyelemental Nanoparticles

Figure 21A:
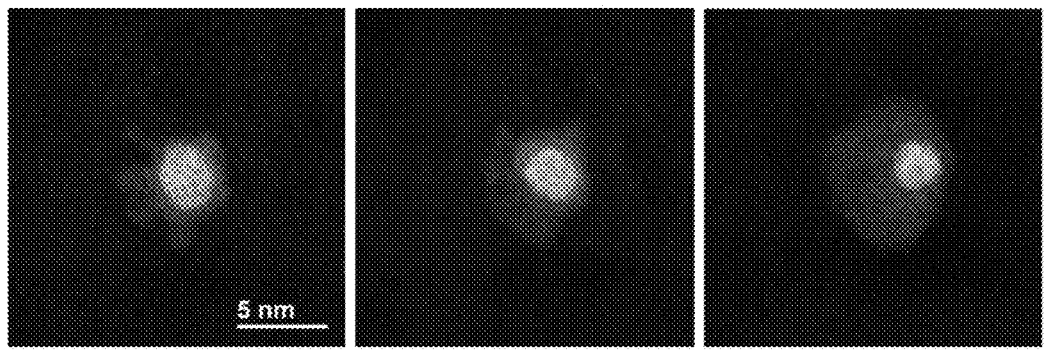
FIG. 21A is time elapsed HAADF-STEM images of a PtNi nanoparticle formed in accordance with the method and being continuously irradiated by electron beam.
Figure 21B:
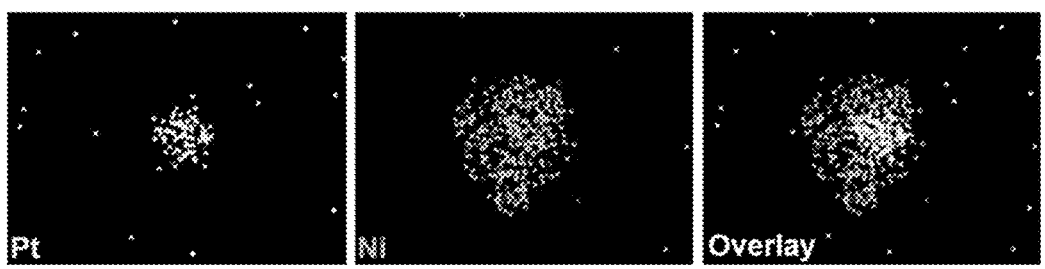
FIG. 21B is an EDS elemental mapping of the PtNi nanoparticle of FIG. 21A shown at the time stage of the far right image of FIG. 21A.
Figures 22A, 22B:
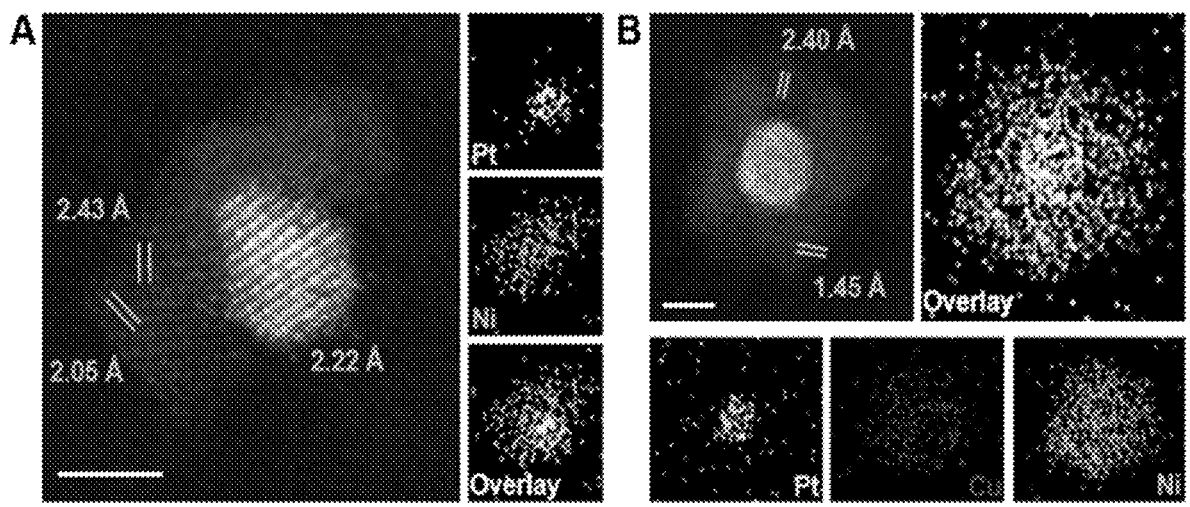
FIGS. 22A and 22B are corresponding HAADF-STEM image, BF-STEM image, and EDS elemental mapping of metal-oxide core-shell nanoparticles formed in accordance with methods of the disclosure after polyelemental nanoparticles are oxidized; scale bar 2 nm.

Non-noble metal constituents (Cu and Ni) in the ultra-small nanoparticles are susceptible to oxidation when the particles are irradiated by electron beam. For example, a NiO shell was readily evolved from a PtNi alloy nanoparticle within minutes during the course of HAADF-STEM characterization (FIGS. 21 and 22). For ultra-small PtCuNi alloy nanoparticles, a shell of Ni-enriched Cu—Ni—O oxide segregated from the PtCuNi core. FIG. 22A shows a $Pt_{0.75}Ni_{0.25}$—NiO core-shell nanoparticle that evolved from a PtNi nanoparticle. The observed lattice spacing of 2.22 Å in the core matches the (111) plane of fcc-structured $Pt_3Ni$ alloy. The lattice spacings of 2.43 Å and 2.05 Å in the shell match the (111) and (200) planes of NiO with a rock salt structure. FIG. 22B shows a $Pt_{0.54}Cu_{0.16}Ni_{0.30}$—$(Cu_{0.3}Ni_{0.7})O$ core-shell nanoparticle that evolved from a PtCuNi nanoparticle. The lattice spacings of 2.40 Å and 1.45 Å match the (111) and (220) planes of homogeneous CuNiO with a rock salt structure.

REFERENCES (1) Li, G.; Jin, R. C., *Acc. Chem. Res.* 2013, 46, 1749.
(2) Hossain, S.; Niihori, Y.; Nair, L. V.; Kumar, B.; Kurashige, W.; Negishi, Y., *Acc. Chem. Res.* 2018, 51, 3114.
(3) Jin, R. C.; Zeng, C. J.; Zhou, M.; Chen, Y. X., *Chem. Rev.* 2016, 116, 10346.
(4) Liu, L. C.; Corma, A., *Chem. Rev.* 2018, 118, 4981.
(5) Kaden, W. E.; Wu, T. P.; Kunkel, W. A.; Anderson, S. L., *Science* 2009, 326, 826.
(6) Liu, Y. M.; Tsunoyama, H.; Akita, T.; Xie, S. H.; Tsukuda, T., *ACS Catal.* 2011, 1, 2.
(7) Zhu, M.; Aikens, C. M.; Hollander, F. J.; Schatz, G. C.; Jin, R., *J. Am. Chem. Soc.* 2008, 130, 5883.
(8) Moliner, M.; Gabay, J. E.; Kliewer, C. E.; Carr, R. T.; Guzman, J.; Casty, G. L.; Serna, P.; Corma, A., *J. Am. Chem. Soc.* 2016, 138, 15743.
(9) Yan, H.; Cheng, H.; Yi, H.; Lin, Y.; Yao, T.; Wang, C. L.; Li, J. J.; Wei, S. Q.; Lu, J. L., *J. Am. Chem. Soc.* 2015, 137, 10484.
(10) Tyo, E. C.; Vajda, S., *Nat. Nanotechnol.* 2015, 10, 577.
(11) Zhu, Y.; Qian, H. F.; Drake, B. A.; Jin, R. C., *Angew. Chem. Int. Ed.* 2010, 49, 1295.
(12) Zhang, H. J.; Lu, L. L.; Kawashima, K.; Okumura, M.; Haruta, M.; Toshima, N., *Adv. Mater.* 2015, 27, 1383.
(13) Wang, T. Y.; Liang, J. S.; Zhao, Z. L.; Li, S. Z.; Lu, G.; Xia, Z. C.; Wang, C.; Luo, J. H.; Han, J. T.; Ma, C.; Huang, Y. H.; Li, Q., *Adv. Energy Mater.* 2019, 9, 1803771.
(14) Herzing, A. A.; Kiely, C. J.; Carley, A. F.; Landon, P.; Hutchings, G. J., *Science* 2008, 321, 1331.
(15) Lei, Y.; Mehmood, F.; Lee, S.; Greeley, J.; Lee, B.; Seifert, S.; Winans, R. E.; Elam, J. W.; Meyer, R. J.; Redfern, P. C.; Teschner, D.; Schlogl, R.; Pellin, M. J.; Curtiss, L. A.; Vajda, S., *Science* 2010, 328, 224.
(16) Yang, M.; Li, S.; Wang, Y.; Herron, J. A.; Xu, Y.; Allard, L. F.; Lee, S.; Huang, J.; Mavrikakis, M.; Flytzani-Stephanopoulos, M., *Science* 2014, 346, 1498.
(17) Kang, X.; Zhu, M. Z., *Chem. Soc. Rev.* 2019, 48, 2422.
(18) Hu, X. Q.; Zheng, Y. K.; Zhou, J. Y.; Fang, D. J.; Jiang, H.; Wang, X. M., *Chem. Mater.* 2018, 30, 1947.
(19) Jamet, M.; Wernsdorfer, W.; Thirion, C.; Mailly, D.; Dupuis, V.; Melinon, P.; Perez, A., *Phys. Rev. Lett.* 2001, 86, 4676.
(20) Sljivancanin, Z.; Pasquarello, A., *Phys. Rev. Lett.* 2003, 90, 247202.
(21) Zhu, M.; Lanni, E.; Garg, N.; Bier, M. E.; Jin, R., *J. Am. Chem. Soc.* 2008, 130, 1138.
(22) Heaven, M. W.; Dass, A.; White, P. S.; Holt, K. M.; Murray, R. W., *J. Am. Chem. Soc.* 2008, 130, 3754.
(23) Wong, A.; Lin, Q.; Griffin, S.; Nicholls, A.; Regalbuto, J. R., *Science* 2017, 358, 1427.
(24) Scott, R. W. J.; Datye, A. K.; Crooks, R. M., *J. Am. Chem. Soc.* 2003, 125, 3708.
(25) Iyyamperumal, R.; Zhang, L.; Henkelman, G.; Crooks, R. M., *J. Am. Chem. Soc.* 2013, 135, 5521.
(26) Imaoka, T.; Akanuma, Y.; Haruta, N.; Tsuchiya, S.; Ishihara, K.; Okayasu, T.; Chun, W. J.; Takahashi, M.; Yamamoto, K., *Nat. Commun.* 2017, 8, 688.
(27) Tsukamoto, T.; Kambe, T.; Nakao, A.; Imaoka, T.; Yamamoto, K., *Nat. Commun.* 2018, 9, 3873.
(28) Pang, X. C.; Zhao, L.; Han, W.; Xin, X. K.; Lin, Z. Q., *Nat. Nanotechnol.* 2013, 8, 426.
(29) Chen, Y. H.; Yang, D.; Yoon, Y. J.; Pang, X. C.; Wang, Z. W.; Jung, J. H.; He, Y. J.; Harn, Y. W.; He, M.; Zhang, S. G.; Zhang, G. Z.; Lin, Z. Q., *J. Am. Chem. Soc.* 2017, 139, 12956.
(30) McCaffrey, R.; Long, H.; Jin, Y. H.; Sanders, A.; Park, W.; Zhang, W., *J. Am. Chem. Soc.* 2014, 136, 1782.
(31) Gologan, B.; Green, J. R.; Alvarez, J.; Laskin, J.; Cooks, R. G., *Phys. Chem. Chem. Phys.* 2005, 7, 1490.
(32) Johnson, G. E.; Wang, C.; Priest, T.; Laskin, J., *Anal. Chem.* 2011, 83, 8069.
(33) Johnson, G. E.; Hu, Q. C.; Laskin, J., Soft Landing of Complex Molecules on Surfaces. *Annual Review of Analytical Chemistry, Vol 4*, Cooks, R. G.; Yeung, E. S., Eds. 2011; Vol. 4, pp 83.
(34) Javey, A.; Dai, H. J., *J. Am. Chem. Soc.* 2005, 127, 11942.
(35) Jibril, L.; Chen, P. C.; Hu, J. T.; Odom, T. W.; Mirkin, C. A., *Acs Nano* 2019, 13, 12408.
(36) Cheng, W. L.; Park, N. Y.; Walter, M. T.; Hartman, M. R.; Luo, D., *Nat. Nanotechnol.* 2008, 3, 682.
(37) Chai, J. A.; Huo, F. W.; Zheng, Z. J.; Giam, L. R.; Shim, W.; Mirkin, C. A., *Proc. Nat. Acad. Sci. U.S.A.* 2010, 107, 20202.
(38) Liu, G. L.; Eichelsdoerfer, D. J.; Rasin, B.; Zhou, Y.; Brown, K. A.; Liao, X.; Mirkin, C. A., *Proc. Nat. Acad. Sci. U.S.A.* 2013, 110, 887.

(39) Chai, J.; Liao, X.; Giam, L. R.; Mirkin, C. A., *J. Am. Chem. Soc.* 2012, 134, 158.
(40) Chen, P. C.; Du, J. S. S.; Meckes, B.; Huang, L. L.; Xie, Z.; Hedrick, J. L.; Dravid, V. P.; Mirkin, C. A., *J. Am. Chem. Soc.* 2017, 139, 9876.
(41) Chen, P. C.; Liu, X. L.; Hedrick, J. L.; Xie, Z.; Wang, S. Z.; Lin, Q. Y.; Hersam, M. C.; Dravid, V. P.; Mirkin, C. A., *Science* 2016, 352, 1565.
(42) Chen, P. C.; Liu, M. H.; Du, J. S. S.; Meckes, B.; Wang, S. Z.; Lin, H. X.; Dravid, V. P.; Wolverton, C.; Mirkin, C. A., *Science* 2019, 363, 959.
(43) Du, J. S.; Chen, P. C.; Meckes, B.; Xie, Z.; Zhu, J. H.; Liu, Y.; Dravid, V. P.; Mirkin, C. A., *Angew. Chem. Int. Ed.* 2017, 56, 7625.
(44) Chen, P. C.; Liu, G. L.; Zhou, Y.; Brown, K. A.; Chernyak, N.; Hedrick, J. L.; He, S.; Xie, Z.; Lin, Q. Y.; Dravid, V. P.; O'Neill-Slawecki, S. A.; Mirkin, C. A., *J. Am. Chem. Soc.* 2015, 137, 9167.
(45) Zhang, H. Y.; Kinnear, C.; Mulvaney, P., *Adv. Mater.* 2019, DOI: 10.1002/adma.201904551.
(46) Flauraud, V.; Mastrangeli, M.; Bernasconi, G. D.; Butet, J.; Alexander, D. T. L.; Shahrabi, E.; Martin, O. J. F.; Brugger, J., *Nat. Nanotechnol.* 2017, 12, 73.
(47) Giovannetti, R., The Use of Spectrophotometry UV-Vis for the Study of Porphyrins. *Macro To Nano Spectroscopy*, Uddin, J., Ed. 2012; pp 87.
(48) Jiang, M. Y.; Dolphin, D., *J. Am. Chem. Soc.* 2008, 130, 4236.

What is claimed:

1. A method of preparing a metal nanoparticle comprising depositing an ink on a substrate using nanolithography to form a polymer reactor, wherein the ink comprises at least one metalloporphyrin functionalized polymer comprising metal ions, porphyrin, and a polyethylene oxide polymer; and
thermally annealing the polymer nanoreactor under conditions sufficient to form the nanoparticle, the thermal annealing comprising:
a first stage comprising annealing the polymer nanoreactor at a temperature and for a time sufficient to aggregate the metal ions in the polymer reactor, and
a second stage comprising annealing the aggregated polymer nanoreactor at a temperature higher than the first stage temperature and for a time sufficient to reduce the metal ion and decompose a polymer component of the polymer nanoreactor to thereby form the metal nanoparticle.

2. The method of claim 1, wherein the nanoparticle has a diameter of about 2 nm or less.

3. The method of claim 1, wherein the nanoparticle comprises 300 metal atoms or less.

4. The method of claim 1, wherein the porphyrin comprises tetraphenylporphyrin.

5. The method of claim 1, wherein the metal ion is one or more ion of Ni, Cu, Pt Co, Zn, Fe, Mg, Pd, Mn, Al, Ga, Cr, Sn, Au, Rh, Ru, In, Ag, Mo, Er, Eu, Gd, or Yb.

6. The method of claim 1, wherein the polyethylene oxide is PEO5k, PEO10k, PEO20k, PEO30k, or PEO40k.

7. The method of claim 1, wherein the ink comprises a mixture of at least two metalloporphyrin functionalized polymers, each metalloporphyrin functionalized polymer having a different metal ion.

8. The method of claim 7, wherein the ink comprises two metalloporphyrin functionalized polymers each having a different metal ion and present in the ink at 1:1 ratio.

9. The method of claim 8, wherein the two metalloporphyrin functionalized polymers have metal ions comprising Pt and Cu, respectively.

10. The method of claim 8, wherein the two metalloporphyrin functionalized polymers have metal ions comprising Pt and Ni, respectively.

11. The method of claim 7, wherein the ink comprises a mixture of three metalloporphyrin functionalized polymers each having a different metal ion.

12. The method of claim 11, wherein the three metalloporphyrin functionalized polymers have metal ions comprising Pt, Cu, and Ni, respectively.

13. The method of claim 11, wherein the ratio of Pt-metalloporphyrin functionalized polymer:Cu-metalloporphyrin functionalized polymer:Ni-metalloporphyrin functionalized polymer is 2:1:1.

14. The method of claim 1, wherein the polymer nanoreactor has a diameter of about 15 nm to about 330 nm.

15. The method of claim 1, wherein the nanoparticle has a diameter of less than 2 nm and comprises less than 300 atoms.

16. The method of claim 1, wherein the first stage comprises heating to a temperature of about 100° C. to about 350° C., and the second stage comprising heating to a temperature of about 500° C. to about 600° C.

17. The method of claim 16, wherein the first stage comprises a multi-step thermal annealing process comprising a first step comprising heating the polymer nanoreactor at a temperature of about 100° C. to about 200° C., and a second step comprising heating the polymer nanoreactor at a temperature higher than the first temperature, the temperature of the second step being about 160° C. to about 350° C.

18. The method of claim 1, further comprising exposing the nanoparticle to an electron beam under conditions sufficient to form an oxide shell.

19. A nanoparticle prepared by the method claim 1.

20. A polyelemental nanoparticle prepared by the method of claim 7.

* * * * *